(12) United States Patent
Feitisch et al.

(10) Patent No.: US 9,646,949 B2
(45) Date of Patent: May 9, 2017

(54) SOLDERLESS MOUNTING FOR SEMICONDUCTOR LASERS

(71) Applicant: SpectraSensors, Inc., Rancho Cucamonga, CA (US)

(72) Inventors: Alfred Feitisch, Los Gatos, CA (US); Gabi Neubauer, Los Gatos, CA (US); Mathias Schrempel, Alta Loma, CA (US)

(73) Assignee: SpectraSensors, Inc., Rancho Cucamonga, CA (US)

( * ) Notice: Subject to any disclaimer, the term of this patent is extended or adjusted under 35 U.S.C. 154(b) by 0 days.

(21) Appl. No.: 14/885,931

(22) Filed: Oct. 16, 2015

(65) Prior Publication Data
US 2016/0111393 A1 Apr. 21, 2016

Related U.S. Application Data

(62) Division of application No. 13/659,019, filed on Oct. 24, 2012, now Pat. No. 9,166,130, and a division of
(Continued)

(51) Int. Cl.
*H01S 5/022* (2006.01)
*H01L 23/00* (2006.01)
(Continued)

(52) U.S. Cl.
CPC ............ *H01L 24/83* (2013.01); *B23K 20/023* (2013.01); *B23K 20/24* (2013.01); *H01L 33/62* (2013.01);
(Continued)

(58) Field of Classification Search
CPC ..................... H01L 24/83; H01L 33/62; H01L 2924/12042; H01L 2224/8385;
(Continued)

(56) References Cited

U.S. PATENT DOCUMENTS 5,265,115 A 11/1993 Amano
5,320,274 A 6/1994 Precious et al.
(Continued)

FOREIGN PATENT DOCUMENTS

CN 101194359 A 6/2008
DE 102006057718 A1 6/2008
(Continued)

OTHER PUBLICATIONS

Hull, Derek. *Fractography: Observing, Measuring and Interpreting Fracture Surface Topography.* Cambridge University Press, 1999. p. 128.
(Continued)

*Primary Examiner* — Xinning Niu
(74) *Attorney, Agent, or Firm* — Mintz Levin Cohn Ferris Glovsky and Popeo, P.C.

(57) ABSTRACT

A first contact surface of a semiconductor laser chip can be formed to a first target surface roughness and a second contact surface of a carrier mounting can be formed to a second target surface roughness. A first bond preparation layer comprising a first metal can optionally be applied to the formed first contact surface, and a second bond preparation layer comprising a second metal can optionally be applied to the formed second contact surface. The first contact surface can be contacted with the second contact surface, and a solderless securing process can secure the semiconductor laser chip to the carrier mounting. Related systems, methods, articles of manufacture, and the like are also described.

10 Claims, 11 Drawing Sheets

Related U.S. Application Data application No. 13/212,085, filed on Aug. 17, 2011, now Pat. No. 9,166,364.

(51) Int. Cl.

| | | |
|---|---|---|
| *H01L 33/62* | (2010.01) | |
| *B23K 20/02* | (2006.01) | |
| *H01S 5/042* | (2006.01) | |
| *B23K 20/24* | (2006.01) | |
| *H01S 5/024* | (2006.01) | |
| *B23K 101/42* | (2006.01) | |

(52) U.S. Cl.
CPC ........ *H01S 5/0226* (2013.01); *H01S 5/02256* (2013.01); *H01S 5/02264* (2013.01); *H01S 5/0425* (2013.01); *B23K 2201/42* (2013.01); *H01L 2224/73265* (2013.01); *H01L 2224/8385* (2013.01); *H01L 2224/83201* (2013.01); *H01L 2924/12042* (2013.01); *H01S 5/02212* (2013.01); *H01S 5/02476* (2013.01)

(58) Field of Classification Search
CPC   H01L 2224/83201; H01L 2224/73265; B23K 20/24; B23K 20/023; B23K 2201/42; H01S 5/0226; H01S 5/02264; H01S 5/02256; H01S 5/0425
See application file for complete search history.

(56) References Cited

U.S. PATENT DOCUMENTS

| | | | |
|---|---|---|---|
| 5,561,322 A | | 10/1996 | Wilson |
| 5,794,839 A | | 8/1998 | Kimura et al. |
| 5,909,458 A | | 6/1999 | Freitas et al. |
| 6,340,846 B1 * | | 1/2002 | LoBianco ........... H01L 23/3128 |
| | | | 257/686 |
| 6,448,642 B1 | | 9/2002 | Bewley et al. |
| 6,531,715 B1 | | 3/2003 | Gerner |
| 7,704,301 B2 | | 4/2010 | Zhou et al. |
| 8,358,417 B2 | | 1/2013 | Feitisch et al. |
| 8,711,357 B2 | | 4/2014 | Liu et al. |
| 8,953,165 B2 | | 2/2015 | Feitisch et al. |
| 9,166,130 B2 | | 10/2015 | Feitisch et al. |
| 9,166,364 B2 | | 10/2015 | Feitisch et al. |
| 2004/0161010 A1 | | 8/2004 | Matsumura |
| 2004/0244421 A1 * | | 12/2004 | Kato ................... B29C 33/3857 |
| | | | 65/26 |
| 2005/0167679 A1 | | 8/2005 | Ishii et al. |
| 2007/0051968 A1 | | 3/2007 | Yamamoto et al. |
| 2007/0064758 A1 | | 3/2007 | Kuramoto et al. |
| 2008/0202677 A1 * | | 8/2008 | Ok .......................... H01L 24/81 |
| | | | 156/272.8 |
| 2009/0092162 A1 * | | 4/2009 | Huff ....................... H01S 5/024 |
| | | | 372/36 |
| 2009/0196316 A1 | | 8/2009 | Konig et al. |
| 2009/0294797 A1 | | 12/2009 | Anzue et al. |
| 2011/0032516 A1 | | 2/2011 | Zhou et al. |
| 2011/0134948 A1 * | | 6/2011 | Kawakami ............. B82Y 20/00 |
| | | | 372/34 |
| 2011/0299076 A1 | | 12/2011 | Feitisch et al. |
| 2011/0299084 A1 | | 12/2011 | Feitisch et al. |
| 2012/0099109 A1 | | 4/2012 | Liu et al. |
| 2012/0236893 A1 | | 9/2012 | Neubauer et al. |
| 2013/0044322 A1 | | 2/2013 | Feitisch et al. |

FOREIGN PATENT DOCUMENTS

| | | |
|---|---|---|
| GB | 1083200 A | 9/1967 |
| JP | 2001168444 A | 6/2001 |
| JP | 2002134822 A | 5/2002 |
| JP | 2002368020 A | 12/2002 |
| JP | 2005026291 A | 1/2005 |
| JP | 2005235061 A | 9/2005 |
| JP | 2007273844 A | 10/2007 |
| JP | 2008211245 A | 9/2008 |
| JP | 4298784 B1 | 7/2009 |
| WO | WO-99/54923 A1 | 10/1999 |
| WO | WO-2012/125752 A1 | 9/2012 |

OTHER PUBLICATIONS

Tandon, et al. "Metallization Systems for Stable OHMIC Contacts to GaAs." *Proceedings of the Workshop on Tungsten and Other Refractory Metals for VLSI Applications.* Oct. 7, 1985. XP-000957401.

Chih-Chiang, K. et al. "Study of dry etching for GaN and InGaN-based laser structure using inductively coupled plasma reactive ion etching." Materials Science and Engineering. B107 (2004)283-288.

* cited by examiner

SOLDERLESS MOUNTING FOR SEMICONDUCTOR LASERS

CROSS-REFERENCE TO RELATED APPLICATIONS

This application is a Divisional of U.S. patent application Ser. No. 13/659,019 filed Oct. 24, 2012 entitled "Solderless Mounting For Semiconductor Lasers" which is related to co-owned U.S. Pat. No. 7,704,301 entitled "Reactive Gas Detection in Complex Backgrounds," to co-pending and co-owned U.S. Patent Application Publication No. 2011/0299076A1 entitled "Spectrometer with Validation Cell," to co-pending and co-owned U.S. Patent Application Publication No. 2011/0299084A1 entitled "Validation and Correction of Spectrometer Performance Using a Validation Cell," to co-pending and co-owned U.S. Patent Application Publication No. 2012/0236893A1 entitled "Semiconductor Laser Mounting for Improved Frequency Stability," to co-pending and co-owned U.S. Patent Application Publication No. 2011/0032516A1 entitled "Optical Absorbance Measurements with Self-Calibration and Extended Dynamic Range," to co-pending and co-owned U.S. Patent Application Publication No. 2012/0099109A1 entitled "Dynamic Reconstruction of a Calibration State of an Absorption Spectrometer," and to co-pending and co-owned unpublished U.S. patent application Ser. No. 13/212,085 entitled "Semiconductor Laser Mounting with Intact Diffusion Barrier Layer." The disclosure of each application identified in this paragraph is incorporated by reference herein in its entirety.

TECHNICAL FIELD

The subject matter described herein relates to frequency stabilization of semiconductor lasers, in particular to mounting techniques for such lasers.

BACKGROUND

A tunable laser-based trace gas analyzer, such as for example a tunable diode laser absorption spectrometer (TDLAS) can employ a narrow line width (e.g. approximately single frequency) laser light source that is tuned across a trace gas absorption frequency range of a target analyte for each measurement of a sample volume of gas. Ideally, the laser light source in such an analyzer exhibits no material change in the starting and ending frequency of successive laser scans under a constant laser injection current and operating temperature. Additionally, it can be desirable to achieve long term stability of the frequency tuning rate of the laser as a function of the laser injection current, over the scan range, and over repetitive scans over a prolonged period of service.

Depending on the operational wavelength, however, currently available tunable laser sources (e.g. diode lasers and semiconductor lasers) can typically exhibit a wavelength drift on the order of a few picometers (on the order of a gigahertz) per day to fractions of picometers per day. A typical trace gas absorption band line width can in some instances be on the order of a fraction of a nanometer to microns. Thus, drift or other variations in the output intensity of the laser light source can, over time, introduce critical errors in identification and quantification of trace gas analytes, particularly in gas having one or more background compounds whose absorption spectra might interfere with absorption features of a target analyte.

SUMMARY

In a first aspect, a method includes forming a first contact surface of a semiconductor laser chip to a first target surface roughness and a second contact surface of a carrier mounting to a second target surface roughness, contacting the first contact surface with the second contact surface, and performing a solderless securing process to further secure the semiconductor laser chip to the carrier mounting.

In an interrelated aspect, an article of manufacture includes a first contact surface of a semiconductor laser chip formed to a first target surface roughness, a second contact surface of a carrier mounting formed to a second target surface roughness, and an interface at which the first contact surface contacts the second contact surface. The semiconductor laser chip is secured to the carrier mounting by a solderless attachment.

In optional variations, one or more of the following features can also be included in any feasible combination. A barrier layer can optionally be deposited on one or more of the first contact surface and the second contact surface. The barrier layer can optionally include one or more of titanium nitride (TiNX), titanium oxy-nitride (TiNXOY), cerium gadolinium oxy-nitride (CeGdONX), platinum (Pt), palladium (Pd), nickel (Ni), tungsten (W), titanium (Ti), tantalum (Ta), zirconium (Zr), cerium (Ce), gadolinium (Gd), chromium (Cr), manganese (Mn), aluminum (Al), beryllium (Be), and Yttrium (Y). The securing process (e.g. that used to form the solderless attachment) can optionally include heating the van der Waals bonded first bond preparation layer and second bond preparation layer to form a persistent mechanical bond between the first metal in the first bond preparation layer and the second metal in the second bond preparation layer. The persistent bond can optionally provide a persistent attachment of the semiconductor laser chip to the carrier mounting. Subsequent to the heating, the barrier layer can optionally remain contiguous such that at least one of the following is true: no direct contact occurs between constituents of the semiconductor laser chip and those of the carrier mounting, and no direct path exists by which constituents of either of the semiconductor laser chip and the carrier mounting can diffuse across the barrier layer.

A first bond preparation layer can optionally be applied to the formed first contact surface and a second bond preparation layer can optionally be applied to the formed second contact surface. The first bond preparation layer can optionally include a first metal and the second bond preparation layer can optionally include a second metal. A barrier layer can optionally be deposited on one or more of the first contact surface and the second contact surface prior to applying at least one of the first bond preparation layer and the second bond preparation layer.

A metallization layer can optionally be applied to at least one of the first contact surface prior to applying the first bond preparation layer and the second contact surface prior to applying the second bond preparation layer. The metallization layer can optionally include greater than approximately 100 Å thickness of titanium. The first metal and the second metal can optionally include a same metal. The same metal can optionally be gold (Au). The second metal can optionally include gold (Au) and the first metal can optionally include at least one of nickel, (Ni), titanium (Ti), platinum (Pt), and gold (Au). The first metal and the second metal each can optionally include one or more of gold (Au), platinum (Pt), palladium (Pd), nickel (Ni), tungsten (W), titanium (Ti), tantalum (Ta), zirconium (Zr), cerium (Ce), gadolinium (Gd), chromium (Cr), manganese (Mn), aluminum (Al), copper (Cu), silver (Ag), Indium (In), silicon (Si), germanium (Ge), rhodium (Rh), rhenium, (Re), beryllium (Be), and Yttrium (Y).

The contacting can optionally include causing van der Waals bonding to at least temporarily hold the semiconductor laser chip on the carrier mounting to facilitate the solderless securing process. The solderless securing process can optionally include heating the van der Waals bonded first bond preparation layer and second bond preparation layer to form a persistent mechanical bond between the first metal in the first bond preparation layer and the second metal in the second bond preparation layer. The persistent bond can optionally provide a persistent attachment of the semiconductor laser chip to the carrier mounting. The heating can optionally include heating a contact plane between the van der Waals bonded first bonding layer and second bonding layer to a diffusion bonding temperature that is greater than approximately 120° C. and less than approximately 500° C. At least one of the applying, the contacting, and the heating can optionally be performed under at least one of a reducing atmosphere and a non-oxidizing atmosphere. A bonding facilitation layer can optionally be added between the first contact surface and the second contact surface on the carrier mounting prior to the contacting. The bonding facilitation layer can optionally include a metal that is not a component of the first bond preparation layer or the second bond preparation layer. The adding of the bonding facilitation layer can optionally include at least one of placing a sheet of the metal between the first contact surface and the second contact surface prior to the contacting, and depositing a layer of the metal that is not a component of the first bond preparation layer or the second bond preparation layer onto one or both of the first contact surface and the second contact surface prior to the contacting of the first contact surface and the second contact surface. The bonding facilitation layer can optionally include at least one of silver (Ag), silicon (Si), germanium (Ge), copper (Cu), copper oxide (CuO), tin (Sn), lead (Pb), antimony (Sb), bismuth (Bi), indium (In), and indium tin lead (InSnPb).

The forming of the first contact surface can optionally include polishing the first contact surface to achieve the first target surface roughness prior to applying the first bonding layer. The forming of the second contact surface can optionally include polishing the second contact surface to achieve the second target surface roughness prior to applying the second bond preparation layer. The first target surface roughness and the second target surface roughness can optionally each be less than at least one of approximately 500 Å rms, approximately 250 Å rms, approximately 100 Å rms, approximately 50 Å rms, and approximately 10 Å rms.

A first thermal expansion characteristic of the semiconductor laser chip can optionally be matched to a second thermal expansion characteristic of the carrier mounting.

The solderless securing process (e.g. that which forms the solderless attachment) can optionally include applying an adhesive composition around at least part of a perimeter of an interface between the first contact surface and the second contact surface. The solderless securing process (e.g. that which forms the solderless attachment) can optionally include applying a mechanical force normal to the second contact surface. The mechanical force can optionally be applied to a top surface of the semiconductor laser chip and can optionally urge the first contact surface into contact with the second contact surface. The top surface of the semiconductor laser chip can optionally be at least approximately opposite to the first contact surface. The top surface can optionally include one or more structural ridges whose elevation above at least one trench etched into the top surface is greater than a second elevation of a lasing portion of the semiconductor laser chip above the at least one trench. The mechanical force can optionally be applied to the one or more structural ridges. The mechanical force can optionally be applied by at least one of top contact block positioned above the top surface and held in place by one or more tensioning devices and a clamping apparatus or other mechanical device having a first thermal expansion coefficient that is less than a second thermal expansion coefficient of the semiconductor laser chip such that thermal expansion of the semiconductor laser chip at a laser operating temperature acts against the clamping apparatus or other mechanical device to cause a compressive force urging the first contact surface into contact with the second contact surface. The adhesive composition can optionally include an electrically non-conducting adhesive having a first thermal expansion coefficient that is less than a second thermal expansion coefficient of the semiconductor laser chip. A continuous portion of the adhesive composition can optionally bond to the carrier mounting and also can optionally overlap onto a top surface of the semiconductor laser chip. The adhesive composition can optionally include a ceramic adhesive having a first thermal expansion coefficient that is less than a second thermal expansion coefficient of the semiconductor laser chip. A continuous portion of the adhesive composition can optionally bond to the carrier mounting and can also optionally overlap onto a top surface of the semiconductor laser chip.

An apparatus, which can in some implementations be a tunable diode laser absorption spectrometer, can further include a light source that includes the carrier mounting and the semiconductor laser chip, a detector that quantifies a received intensity of light emitted from the light source along a path length, at least one of a sample cell and a free space volume through which the path length passes at least once, and at least one processor that performs operations comprising controlling a driving current to the laser source and receiving intensity data from the detector. The carrier mounting can include and/or act as a heat spreader, heat sink, or the like. The at least one processor can optionally cause the laser source to provide light having a wavelength modulation frequency and can demodulate the intensity data received from the detector to perform a harmonic spectroscopy analysis method. The at least one processor can mathematically correct a measurement spectrum to account for absorption by compounds in a sample gas through which the light passes. In some examples, the mathematical correction can include subtraction of a reference spectrum from the measurement spectrum where the reference spectrum is collected for a sample of the sample gas in which a concentration of a target analyte has been reduced, for example as part of a differential absorption spectroscopy approach.

Systems and methods consistent with this approach are described as well as articles that comprise a tangibly embodied machine-readable medium operable to cause one or more machines (e.g., computers, etc.) to result in operations described herein. Similarly, computer systems are also described that may include a processor and a memory coupled to the processor. The memory may include one or more programs that cause the processor to perform one or more of the operations described herein.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

The accompanying drawings, which are incorporated in and constitute a part of this specification, show certain aspects of the subject matter disclosed herein and, together with the description, help explain one or more features or the principles associated with the disclosed implementations. In the drawings.

When practical, similar reference numbers denote similar structures, features, or elements.

DETAILED DESCRIPTION

Experimental data have revealed that laser emission wavelength changes as small as 1 picometer (pm) or less between spectral scans in a laser absorption spectrometer using a scannable or tunable laser source can materially alter a trace gas concentration determination with respect to a measurements obtainable with a spectral analyzer in its original calibration state. An example of spectral laser spectroscopy using a differential spectroscopy approach is described in co-owned U.S. Pat. No. 7,704,301. Other experimental data have indicated that a tunable diode laser-based analyzer designed for low analyte concentration detection and quantification (e.g. on the order of parts per million (ppm) of hydrogen sulfide ($H_2S$) in natural gas) and employing a harmonic (e.g. 2 f) wavelength modulation spectral subtraction approach can unacceptably deviate from its calibration state due to a shift in laser output of as small as 20 picometers (pm) at constant injection current and constant temperature (e.g. as controlled by a thermoelectric cooler).

In general terms, a laser frequency shift that can be acceptable for maintaining an analyzer calibration within its accuracy specification drops with smaller target analyte concentrations and also with increasing spectral interferences from other components of a sample mixture at the location of the target analyte absorption. For measurements of higher levels of a target analyte in a substantially non-absorbing background, larger laser frequency shifts can be tolerated while maintaining the analyzer calibration state.

Figure 1:
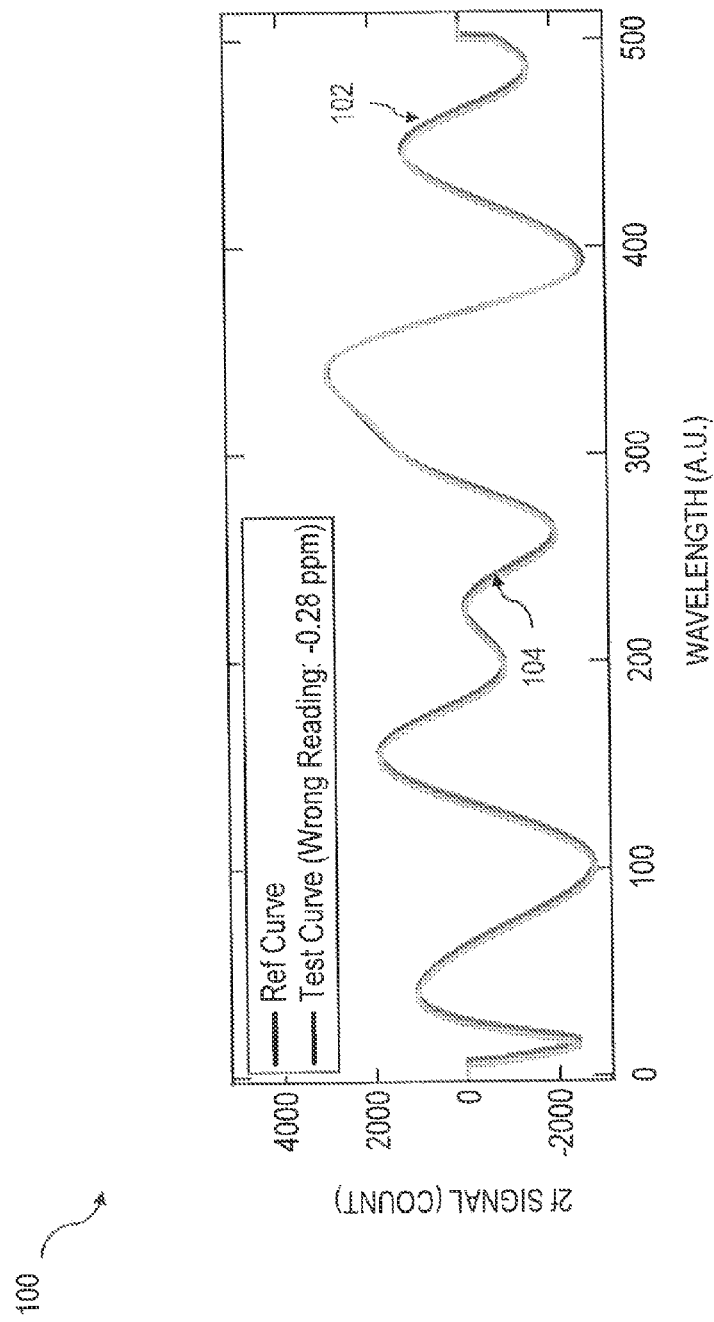
FIG. 1 is a graph illustrating effects of laser drift on performance of a laser absorption spectrometer.
Figure 2:
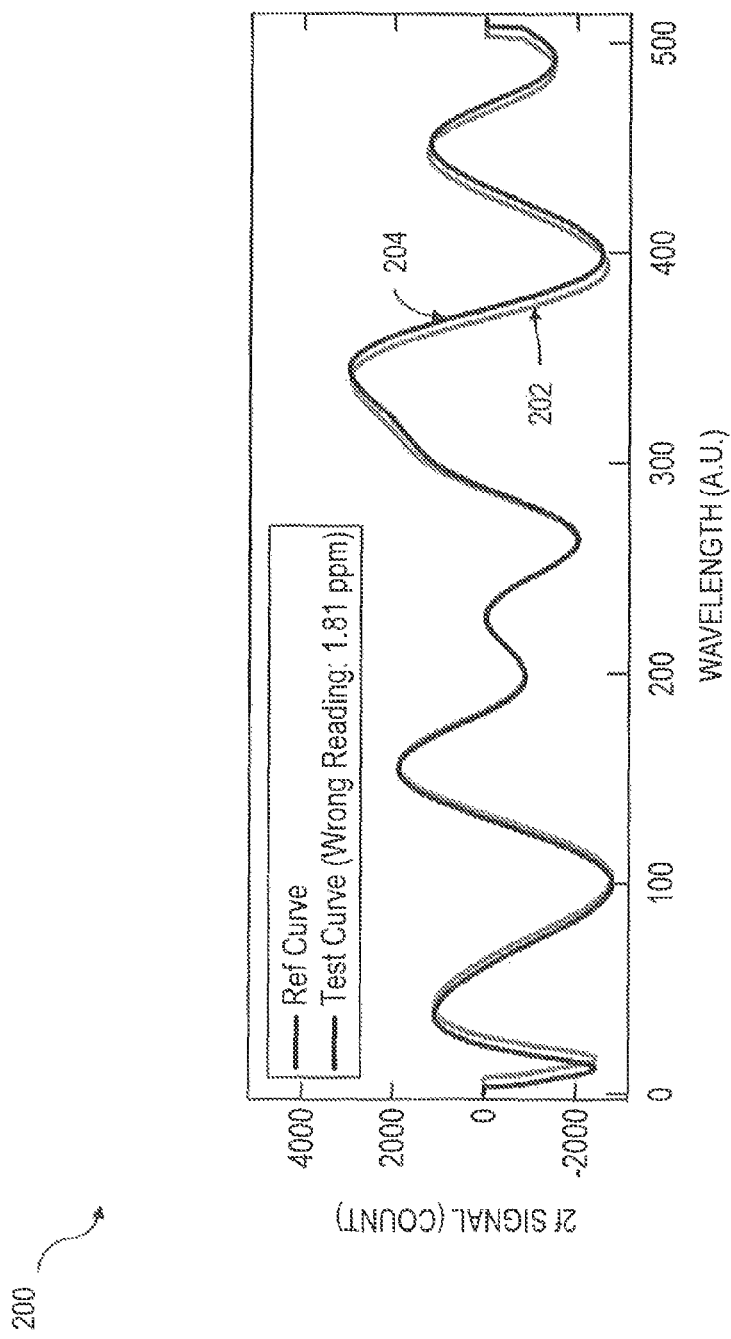
FIG. 2 is a second graph illustrating additional effects of laser drift on performance of a laser absorption spectrometer.

The graphs 100 and 200 of FIG. 1 and FIG. 2, respectively, show experimental data illustrating potential negative impacts of laser output variations that may be caused by changes in characteristics (e.g. physical, chemical, and the like) of a semiconductor laser source over time. The reference curve 102 shown in the graph 100 of FIG. 1 was obtained with a tunable diode laser spectrometer for a reference gas mixture containing approximately 25% ethane and 75% ethylene. The test curve 104 was obtained using the same spectrometer after some time had passed for a test gas mixture containing 1 ppm acetylene in a background of approximately 25% ethane and 75% ethylene. Acetylene has a spectral absorption feature in the range of about 300 to 400 on the wavelength axis of the chart 100 in FIG. 1. If the spectrometer were not adjusted in some manner to compensate for the drift observed in the test curve 104 relative to the reference curve 102, the measured concentration of acetylene from the spectrometer would be, for example, −0.29 ppm instead of the correct value of 1 ppm.

Similarly, in FIG. 2, the chart 200 shows a reference curve 202 obtained with a tunable diode laser spectrometer for a reference gas mixture containing approximately 25% ethane and 75% ethylene. The test curve 204 was obtained for a test gas mixture containing 1 ppm acetylene in a background of approximately 25% ethane and 75% ethylene. As shown in FIG. 2, the line shape of the test curve 204 is distorted relative to the line shape of the reference curve 202 due to drift or other factors affecting performance of the laser absorption spectrometer over time. If the test curve 204 were not corrected to compensate for the distortion observed in the test curve 204 relative to the reference curve 202, the measured concentration of acetylene in the test gas mixture determined by the spectrometer would be, for example, 1.81 ppm instead of the true concentration of 1 ppm.

Based on Ohm's Law (i.e. $P=I^2R$ where P is the power, I is the current, and R is the resistance), a current-driven semiconductor laser chip generates waste heat that increases approximately as the square of the injection current driving the laser. While the resistance, R, of the semiconductor diode laser assembly is not typically linear or constant with changes in temperature, an approximately quadratic increase in waste heat with increases in current is generally representative of real-world performance. Thermal roll-over, in which the power output of a semiconductor laser is reduced at excessive temperatures, can typically occur because the lasing efficiency of a typical band-gap type direct semiconductor laser diode decreases with increasing p-n junction operating temperature. This effect can be particularly important for infrared semiconductor lasers, such as for example lasers based on indium phosphide (InP), gallium antimonide (GaSb), gallium arsenide (GaAs), or gallium nitride (GaN) material systems.

Single frequency operation of an infrared semiconductor laser can be achieved by employing DFB (distributed feedback) schemes, which typically use optical gratings, either incorporated in the laser ridge of the semiconductor laser crystal in the form of semiconductor crystal index of refraction periodicities, placed laterally to the laser ridge as metal bars, incorporated into the vertical sidewalls of the laser ridge as undulating extensions of the semiconductor material with a periodicity corresponding to an nth order grating of a respective wavelength or the like. The effective optical periods of the approaches of the various gratings determining the laser emission wavelength can typically depend upon the physical spacing of the metal bars of the grating, the width and spacing of the semiconductor material sidewall extensions or upon the physical dimension of the ridge-regrown semiconductor material zones with different index of refraction and the index of refraction of the respective semiconductor materials. In other words, the emission wavelength of a semiconductor laser diode, such as those typically used for tunable diode laser spectroscopy, can depend primarily upon the laser p-n junction, the semiconductor laser wave guide layers, the grating periodicity and grating order, and the laser crystal operating temperature, and secondarily on the carrier density inside the laser. The laser crystal temperature can change the grating period as a function of the temperature dependent thermal expansion of the laser crystal along its long optical cavity axis and as a function of the temperature-dependent index of refraction.

Typical injection current-related and temperature-related wavelength tuning rates of infrared lasers useable for tunable diode laser trace gas analyzers can be on the order of approximately 0.1 nanometers per ° C. and approximately 0.01 nanometers per milli-ampere or in other examples on the order of approximately 0.02 to 0.05 nanometers per milli-ampere. As such, it can be desirable to maintain semiconductor laser diodes for precision TDLAS devices at a constant operating temperature within a few thousandths of a ° C. and at injection currents that are controlled to within a few nano-amperes.

Long term maintenance and regeneration of a TDLAS calibration state and the related long term measurement fidelity with respect to the original instrument calibration can require the ability to substantially replicate the correct laser operating parameters in the wavelength space for any given measurement. This can be desirable for spectroscopy techniques employing subtraction of spectral traces (e.g. differential spectroscopy) or performance of other mathematical transformations, combinations, or the like on such traces, such as is described in co-owned U.S. Pat. No. 7,704,301 and co-owned and co-pending U.S. Patent Applications Publication nos. 2011/0299076A1, 2011/0299084A1, 2011/0032516A1, 2012/0099109A1.

Commercially available single frequency semiconductor lasers that are suitable for trace gas spectroscopy in the 700 nm to 4000 nm spectral range as well as direct pn-junction type lasers operating in the 3 µm to 3.5 µm spectral range have been found to generally exhibit a drift of their center frequency over time. Drift rates of several picometers (pm) to fractions of a pm per day have been confirmed by performing actual molecular trace gas spectroscopy over periods of 10 days to more than 100 days. Lasers that may behave as described can include, but are not limited to, lasers limited to single frequency operation by gratings incorporated into the top of the laser ridge (e.g. conventional telecommunications grade lasers), gratings laterally coupled into the waveguide, grating structures vertically coupled to the waveguide, Bragg gratings (e.g. vertical cavity surface emitting lasers or VCSELs), multiple layer narrow band dielectric mirrors, laterally coupled gratings, other types of diffraction grating, and the like. Frequency drift behavior has been observed with semiconductor diode lasers; VCSELs; horizontal cavity surface emitting lasers HCSEL's (HCSELs); quantum cascade lasers built on semiconductor materials including but not limited to indium phosphide (InP), gallium arsenide (GaAs), gallium antimonide (GaSb), gallium nitride (GaN), indium gallium arsenic phosphide (InGaAsP), indium gallium phosphide (InGaP), indium gallium nitride (InGaN), indium gallium arsenide (InGaAs), indium gallium aluminum phosphide (InGaAlP), indium aluminum gallium arsenide (InAlGaAs), indium gallium arsenide (InGaAs), and other single and multiple quantum well structures.

Approaches have been previously described to re-validate the performance of a tunable laser. For example, as described in U.S. Patent Application Publication nos. 2011/0299076A1 and 2011/0299084A1, a reference absorption line shape collected during a calibrated state of an analyzer can be compared to a test absorption line shape collected subsequently. One or more operating parameters of the analyzer can be adjusted to cause the test absorption line shape to more closely resemble the reference absorption line shape.

Reduction of the underlying causes of frequency instability in semiconductor-based tunable lasers can also be desirable, at least because compensation of laser shift and outputted line shapes to maintain analyzer calibration by adjusting the semiconductor diode laser operating temperature or the median drive current may only be possible over limited wavelength shifts due to a typically non-linear correlation between injection current and frequency shift in semiconductor laser diodes (e.g. because of thermal roll-over as discussed above). The nonlinearity of the frequency shift as a function of injection current may change as a function of laser operating temperature set by a temperature control device (e.g. a thermoelectric cooler or TEC) and the median injection current. At higher control temperatures, thermal roll-over may occur at lower injection currents while at lower control temperatures, the roll-over may occur at higher injection currents. Because the control temperature and injection current combined determine the laser emission wavelength, not all combinations of control temperature and median injection current used to adjust the laser wavelength to the required target analyte absorption line will provide the same frequency scan and absorption spectra.

Figure 3:
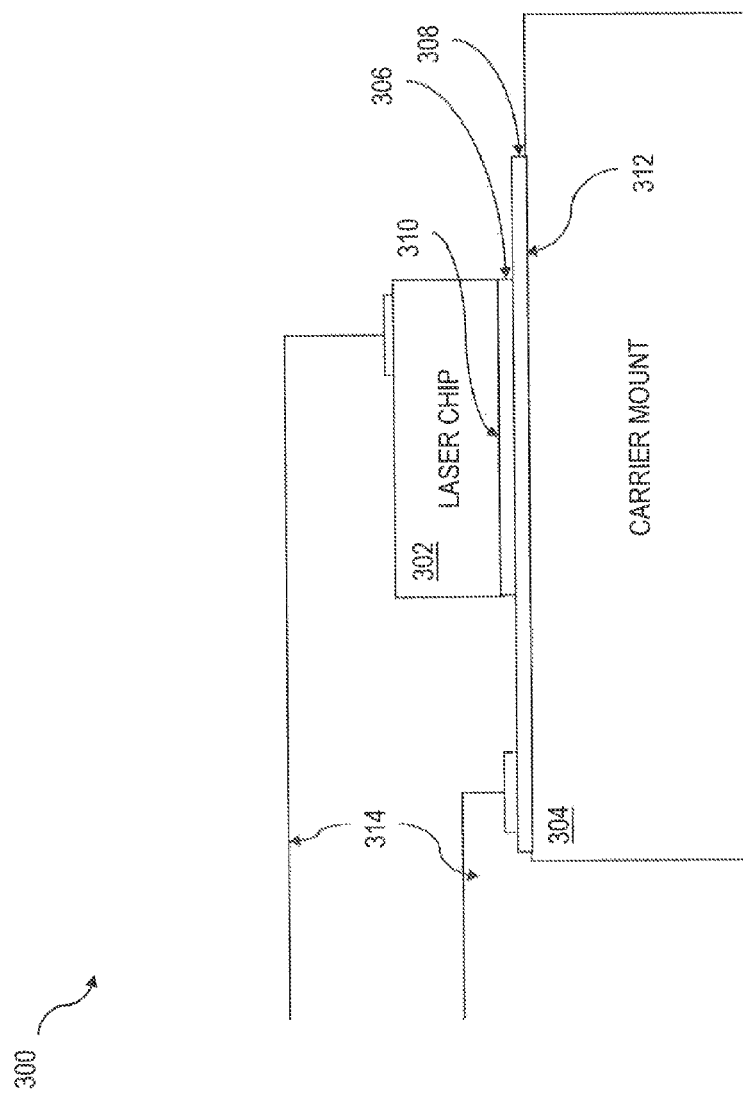
FIG. 3 is a diagram illustrating a semiconductor laser chip secured to a carrier mounting consistent with one or more implementations of the current subject matter.

FIG. 3 illustrates an example of a mounted semiconductor laser apparatus 300 consistent with implementations of the current subject matter in which a semiconductor laser chip 302 is affixed to a carrier mount 304. As shown in FIG. 3, consistent with some implementations of the current subject matter, the semiconductor laser chip 302 is affixed to the carrier mount 304 by joining of first and second bond preparation layers 306, 308 respectively associated with a first contact surface 310 of the semiconductor laser chip 302 and a second contact surface 312 of the carrier mount or other mounting device 304. As used herein and throughout the remainder of the disclosure, the terms "carrier mount" and "carrier mounting" refer generally to any kind of device or other structure upon which a semiconductor laser chip 302 is attached, supported, or otherwise secured to or onto. A carrier mounting can include one or more of heat spreading (e.g. a heat sink), electrical conductivity, and mechanical support features, and can be generally characterized as a structure or device having a second contact surface 312 capable of being joined to a first contact surface 310 of a semiconductor laser chip 302.

Unlike in a conventional approach, in which a semiconductor laser chip 302 is typically affixed to the mounting device 304 through a soldering process, implementations of the current subject matter include approaches and techniques that avoid the need for solder and thereby can eliminate or at least reduce the possibility of electrical resistivity changes in the semiconductor laser injection current path and thermal or chemical damage to the semiconductor laser chip 302 and related operating temperature changes of the semiconductor laser pn-junction. The mounting device 304 can optionally function as a heat sink and can provide one or more electrical connections to the semiconductor laser chip 302. One or more other electrical connections 314 can be provided to connect a p- or n-junction of the semiconductor laser chip 302 to a first polarity and the other junction to a second polarity, for example via conduction through the first and second bond preparation layers 306, 308 into the carrier mount 304.

In other approaches to joining of a semiconductor laser chip 302 and a carrier mount or other mounting device 304 As described in co-owned and co-pending U.S. Patent Application Publication No. 2012/0236893A1 and co-owned and co-pending unpublished U.S. patent application Ser. No. 13/212,085, a first contact surface 310 of a laser semiconductor chip 302 and/or a second contact surface 312 of the mounting device (e.g. a carrier mounting) 304 can be polished or otherwise prepared for soldering such that the first contact surface 310 and the second contact surface 312 each have a target surface roughness that is sufficiently smooth that one or more barrier layers of a metallic material or a non-metallic electrically-conducting material or compound applied on the first contact surface 310 and/or the second contact surface 312 is thicker than the peak to valley distance of surface roughness features on the first and second contact surfaces 310, 312. As described in the two referenced applications, a soldering process is performed at a temperature lower than a threshold temperature at which the barrier layer material substantially dissolves into a solder material disposed between the first and second contact surfaces 310, 312 such that an intact barrier layer remains subsequent to the soldering process and no direct diffusion path exist between the semiconductor laser chip material and the solder layer.

However, even the best executed, pure, multi-component solder alloy joints can, over time, experience non-negligible changes between different crystalline or grain structures, which can cause changes in the electrical resistivity of the solder joint and thus shift the laser frequency emitted from a semiconductor laser chip 302 mounted to a carrier device 304 via such a joint. Changes of the solder crystalline composition and grain structure have been observed to occur for gold tin (AuSn) solders. For example, an AuSn solder alloy can vary in crystalline structure between AuSn, $AuSn_2$, and $AuSn_4$. Similar issues occur for other solder compositions, such as for example gold indium (AuIn), lead tin gold (PbSnAu), and the like.

Recent experiments with semiconductor lasers used in gas analyzers have revealed frequency shifts on the order of approximately 0.0625 picometers (pm) per day over a 9-month period even when an analyzer had been in storage and the laser had not been energized. These significant shifts from an initial analyzer calibration state have been attributed to slow changes in the solder joint resistivity, for example due to changes in the crystalline composition. In devices using lead tin (PbSn) solder compositions in conjunction with a gold (Au) barrier layer or solder preparation layer, the melted solder composition can rearrange itself into zones of primarily AuSn layers close to the metallized semiconductor laser chip and mounting device contact surfaces, for example as can be seen from the electron micrograph and the accompanying elemental distribution charts shown in co-owned and co-pending U.S. Patent Application Publication No. 2012/0236893A1.

Heterogeneity in the grain structure of solder material in a solder layer, oxidization or other reactions occurring with or between compounds present in a solder layer or in barrier or metallization layers on either or both of a semiconductor laser chip 302 and a mounting device 304 or other surface to which the a semiconductor laser chip 302 is affixed can become a more important impediment to achieving optimal laser performance as the sensitivity required from a laser-based measurement increases. An improved solution to affixing a semiconductor laser chip 302 to a carrier mount 304 is therefore desirable for at least these reasons.

Accordingly, one or more implementations of the current subject matter relate to methods, systems, articles or manufacture, and the like that can, among other possible advantages, provide semiconductor-based lasers that have substantially improved frequency stability characteristics due to one or more approaches for affixing a semiconductor laser chip 302 to a carrier mounting 304 that provide improved temporal and thermal stability of the chemical composition of materials at the boundary between the semiconductor laser chip 302 to a carrier mounting 304. Drift of single frequency lasers can be reduced or even minimized, according to one or more implementations, by employing semiconductor laser designs, laser processing, electrical connections, and heat sinking features that reduce changes in heat conductivity, in stress and strain on the active semiconductor laser, and in electrical resistivity of the injection current path over time. Additional potential advantages of implementations of the current subject matter may relate to avoidance of multi-component solder alloys, which have been observed to change their crystallization and grain properties over time, leading to changes in electrical resistivity, heat conductivity and laser frequency. Some implementations of the current subject matter include connection of a semiconductor laser chip and a mounting device at first and second contact surfaces, respectively, using a solid phase bonding process as described in greater detail below.

In other implementations, the first and second contact surfaces 310, 312 can be held in contact by one or more of a device applying a mechanical force in a direction at least partially orthogonal to a plane at which the first and second contact surfaces 310, 312 come into contact with each other; an adhesive applied around a perimeter of either or both of the first and second contact surfaces 310, 312; or the like. Still other implementations can include affixing, using one or more approaches described herein or their functional or structural equivalents, a semiconductor laser chip 302 to a non-conductive carrier mounting 304 and forming electrical connections via one or more contact pads electrically connected to one or more of the semiconductor laser chip and a metallization layer applied on a contact surface of the carrier mounting 304.

Figure 4:
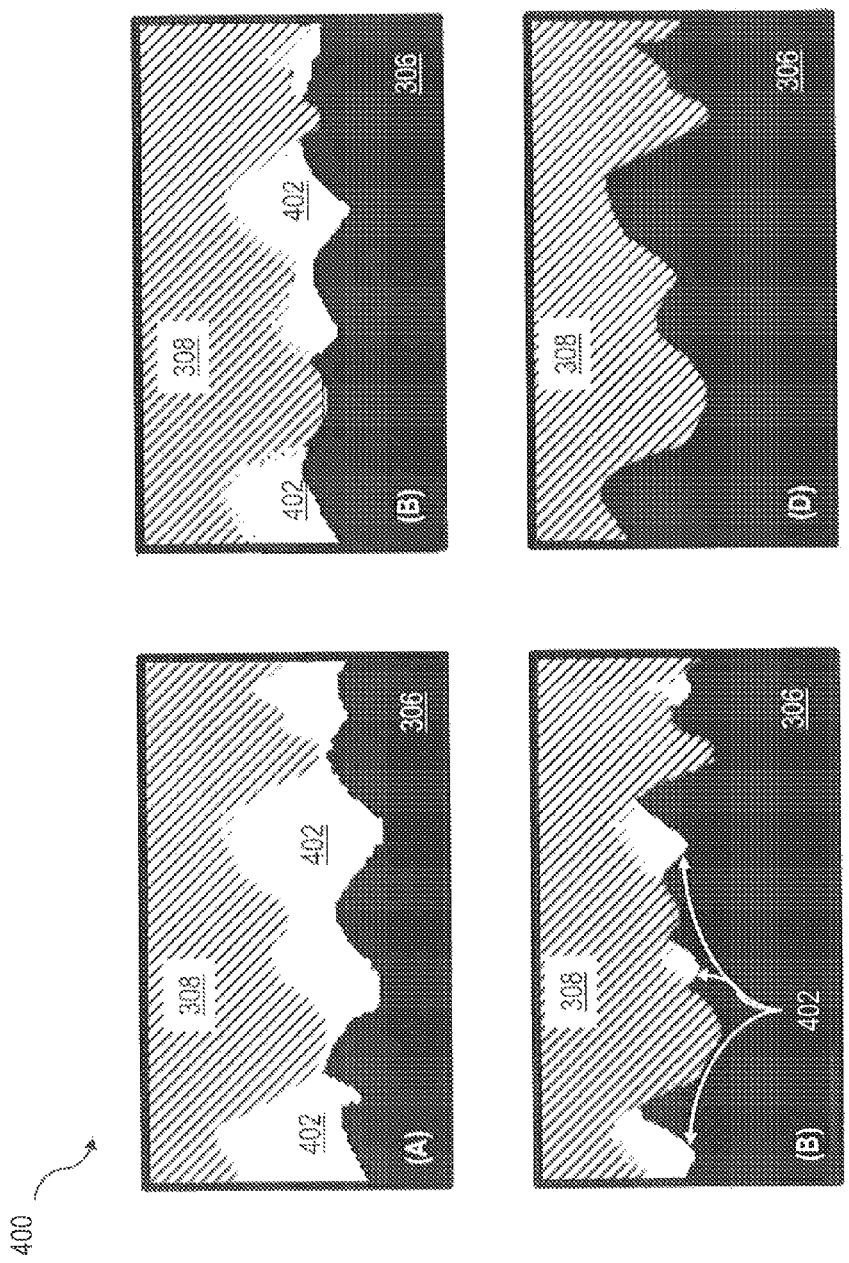
FIG. 4 is a diagram showing an example of a diffusion bonding process sequence.

Metal diffusion bonding can be used in fabrication of complex metallic structures, and typically requires very high compression pressures and temperatures in addition to extended processing times to make relatively rough surfaces conform and thereby allow the metals to diffuse together forming a mechanically stable, hermetic joint. FIG. 4 shows a sequence of views 400 of an example of a diffusion bonding process in which a first material of a first bond preparation layer 306 and a second material of a second bond preparation layer 308 are bonded at an interface between them. In panel (A), when the first material of the first bond preparation layer 306 and the second material of the second bond preparation layer 308 are first brought into contact, surface roughness features on the surface of each material leads to the presence of voids 402. Through the application of heat and pressure over time, the voids 402 are gradually diminished in scale as shown in the series of panels (B) and (C) until in panel (D) the crystalline structures of the first material of the first bond preparation layer 306 and the second material of the second bond preparation layer 308 are rearranged to make the interface between them substantially devoid of voids.

Semiconductor laser chips generally cannot tolerate the typical pressures and temperatures used in joining of metal parts by diffusion bonding, particularly when maintenance of extremely high stability of the laser frequency response of the semiconductor laser chip 302 is desired. To overcome this limitation of conventional diffusion bonding processes, implementations of the current subject matter can use less severe process conditions which can be made effective by pre-forming at least one of the first contact surface 310 of a semiconductor laser chip 302 and the second contact surface 312 of a carrier mounting 304 to a sufficiently smooth surface roughness condition that van der Waals forces or other temporary and/or relatively weak attractive forces can at least temporarily secure the bond between the first contact surface 310 and the second contact surface 312. Because the interface between smooth surfaces includes fewer and smaller voids, some implementations of the current subject matter can include application of relatively lower temperatures and compression forces to create a mechanically persistent bond.

Diffusion bonding of a semiconductor laser chip 302 to a carrier mounting 304, which can include a substantially planar (e.g. flat) and sufficiently smooth surface. A sufficiently smooth surface can in some implementations of the current subject matter be defined as having a surface roughness of less than approximately 250 Å, less than approximately 100 Å, less than approximately 50 Å, or the like.

Figure 5:
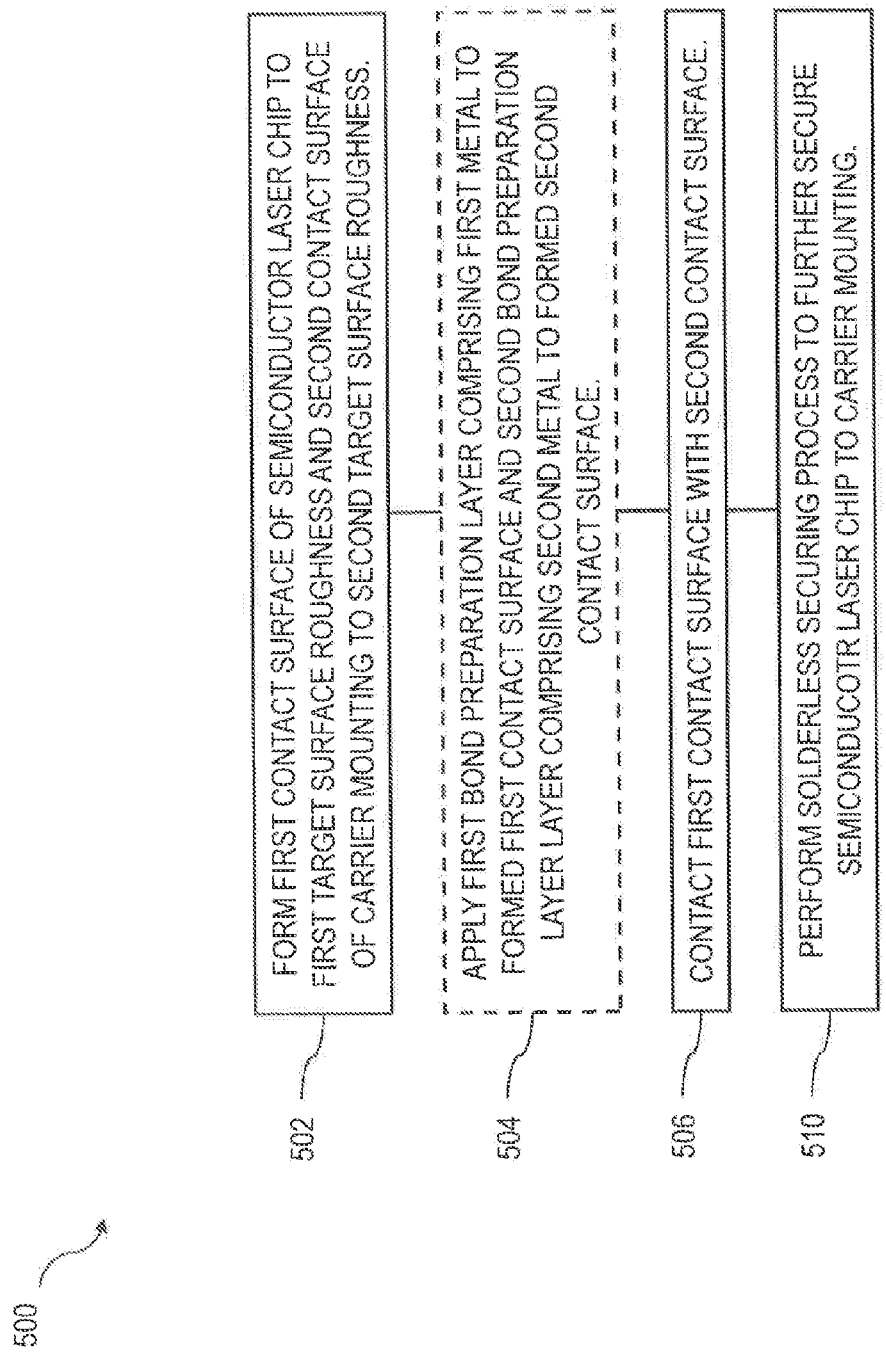
FIG. 5 is a process flow diagram illustrating aspects of a method having one or more features consistent with implementations of the current subject matter.

FIG. 5 shows a process flow chart 500 illustrating a method including features that can be present in one or more implementations of the current subject matter. At 502, a first contact surface 310 of a semiconductor laser chip 302 is formed to a first target surface roughness and a second contact surface 312 of a carrier mounting 304 if formed to a second target surface roughness. At 504, a first bond preparation layer 306 can optionally be applied to the formed first contact surface 310 and a second bond preparation layer can optionally be applied to the formed second contact surface 312. The first bond preparation layer 306 can include a first metal and the second bond preparation layer can include a second metal. The first contact surface 310 is contacted at 506 with the second contact surface 312. In some examples, the contacting can optionally result in van der Waals or electrostatic bonding at least temporarily holding the semiconductor laser chip 302 on the carrier mounting or other mounting device 304. At 510, a solderless securing process is performed. The securing process can optionally include the van der Waals bonded first bond preparation layer 306 and second bond preparation layer 308 being heated to form a more persistent bond, which can in some implementations be a diffusion bond, between the first metal in the first bond preparation layer 306 and the second metal in the second bond preparation layer 308 such that the persistent bond provides a persistent attachment of the semiconductor laser chip 302 to the carrier mounting 304. Alternatively, a solderless securing process can include adding an adhesive (e.g. epoxy, a ceramic adhesive, or the like) around at least part of a perimeter of the semiconductor laser chip 302. In other implementations of the current subject matter discussed below, a solderless securing process can include use of a mechanical apparatus that holds the first contact surface 310 of the semiconductor laser chip 302 in contact with the second contact surface 312 of the carrier mounting. Still other implementations of the current subject matter can include mismatched thermal expansion features that urge the first contact surface 310 into compressive contact with the second contact surface 312.

As noted above, in some implementations of the current subject matter, a solderless securing process includes diffusion bonding. At least in these implementations, the first metal and the second metal can be either a same metal or a different metal. In one implementation, the first metal and the second metal are gold. A diffusion bond formed between a first bond preparation layer 306 including or optionally at least substantially consisting of gold that is applied to a first contact surface 310 on a semiconductor laser chip 302 and a second bond preparation layer 308 including or optionally at least substantially consisting of gold that is applied to a second contact surface 312 on a carrier mounting o 304 can be advantageous due to the elimination (or at least substantial reduction) of an opportunity to create different compositions, which may change over time. Oxidation of either of the first bond preparation layer 306 or the second bond preparation layer 308 can inhibit or at least slow down forming of the metal inter-diffusion bond. The use of gold as the primary material of at least one of the first and the second bond preparation layers 306, 308 can be helpful in avoiding oxidation during those production steps (e.g. cleaving, handling, facet coating, etc.) occurring between applying the bond preparation layer(s) 306, 308 and bonding of the semiconductor laser chip 302 to the carrier mounting 304.

Creation of a first contact surface 310 and second contact surface 312 that are sufficiently smooth to participate in van der Waals, electrostatic, or other similar types of reversible bonding upon being brought into contact with one another can be accomplished by reducing the initial surface roughness of the first and/or second contact surfaces. Reducing the surface roughness of one or more of the first contact surface 310 and the second contact surface 312 can also assist in maintaining a contiguous barrier layer that can survive the bonding process such that no direct contact and/or an open diffusion pathway remains for transport of materials between the bulk of the semiconductor laser chip 302 and the carrier mounting 304. This reducing of the initial surface roughness can be accomplished by using one or more techniques, such as for example polishing, burnishing, chemical-mechanical polishing, etching, plasma erosion, ion beam milling, laser ablation, radio frequency ablation, transient heat zone melting, water jet polishing, fire polishing, or the like. In one example, the second contact surface can include a diamond-turned copper surface. Other metal or non-metal materials can be formed to a sufficiently low surface roughness using a diamond turning technique. In general, a total thickness of a bond preparation layer, a barrier layer, a metallization layer, or the like applied to either of the first contact surface 310 or the second contact surface 312, may be limited due to elevated stresses that can lead to a separation of thicker layers from the semiconductor material of the semiconductor laser chip 302 or the body of the carrier mounting 304. Each of the first bond preparation layer 306 and the second bond preparation layer 308 can optionally include one or more layers of differing materials. For example, in an implementation, either or both of the first metal or the second metal in the first bond preparation layer 306 and the second bond preparation layer 308 can include at least one of gold (Au), platinum (Pt), palladium (Pd), nickel (Ni), tungsten (W), titanium (Ti), tantalum (Ta), zirconium (Zr), cerium (Ce), gadolinium (Gd), chromium (Cr), manganese (Mn), aluminum (Al), copper (Cu), silver (Ag), Indium (In), silicon (Si), germanium (Ge), rhodium (Rh), rhenium, (Re), beryllium (Be), and Yttrium (Y). The first metal and the second metal can optionally be or include the same metal. In a particular implementation, the second metal can include gold (Au) and the first metal can include at least one of titanium (Ti), platinum (Pt), and gold (Au).

In an implementation, either or both of the first bond preparation layer 306 and the second bond preparation layer 308 can be applied atop a barrier layer that is first deposited on either or both of the formed first contact surface 310 and the formed second contact surface 312. One or more barrier layers deposited on the first contact surface 310 and/or the second contact surface 312 can optionally include a non-metallic, electrically conducting compound, such as for example titanium nitride ($TiN_X$), titanium oxy-nitride ($TiN_XO_Y$), cerium gadolinium oxy-nitride ($CeGd_yON_X$), cerium oxide ($CeO_2$), and tungsten nitride ($WN_x$), or a metal including but not limited to platinum (Pt), palladium (Pd), nickel (Ni), tungsten (W), molybdenum (Mo) titanium (Ti), tantalum (Ta), zirconium (Zr), cerium (Ce), gadolinium (Gd), chromium (Cr), manganese (Mn), aluminum (Al), beryllium (Be), and Yttrium (Y). Alternatively, the first bond preparation layer 306 and the second bond preparation layer 308 can be applied directly onto the formed first contact surface 310 and the formed second contact surface 312, and can optionally both include a single, same metal (e.g. gold, platinum, titanium, nickel, copper, silver, lead, tin, indium).

In some implementations in which diffusion bonding or van der Waals bonding are used to form either or both of a permanent or temporary bond between a first contact surface 310 and second contact surface 312, a contact surface 310 of a laser semiconductor chip 302 can be polished or otherwise formed to have a target surface roughness of less than approximately 500 Å rms, less than approximately 250 Å rms, less than approximately 100 Å rms, less than approximately 50 Å rms, less than approximately 10 Å rms, or the like. In one implementation, a carrier mounting 304, for example one formed of a silicon crystal, can be prepared by polishing to form a sufficiently smooth second contact surface 312 having a second target surface roughness, for example having a second target surface roughness of less than approximately 500 Å rms, less than approximately 250 Å rms, less than approximately 100 Å rms, less than approximately 50 Å rms, or the like. The second contact surface can be metallized by deposition of a layer of gold (Au) or some other bond preparation layer material. Other bond preparation layer materials usable in the second bond preparation layer 308 on the second contact surface 312 can include without limitation, titanium (Ti), platinum (Pt), copper (Cu), silver (Ag). The first contact surface 310 of the semiconductor laser chip 302 can also be polished consistent with implementations of the current subject matter to a sufficiently smooth first target surface roughness, and can then be metallized by deposition of a layer of one or more of titanium, platinum (Pt), palladium (Pd), nickel (Ni), gold (Au), copper (Cu), silver (Ag), or the like to form a first bond preparation layer 306.

For a diffusion bonding approach, the first contact surface 310 and the second contact surface 312 can be pressed together while heat is applied for a sufficient time and at a sufficient diffusion bonding temperature, which can optionally be in a range of approximately 120° C. to approximately 400° C. at a pressure of as much as approximately 5.5 MPa or more for a treatment time that is optionally on the order of minutes or one or more hours, to cause the first and second metals of the first and second bond preparation layers 306, 308 on the first and the second contact surfaces 310, 312, respectively, to inter-diffuse with one another, thereby forming a diffusion bond between the semiconductor laser chip 302 and the carrier mounting 304. Constructing such a uni-metal contact in this manner can be very electrically stable under typical laser operating conditions. The resultant diffusion-bonded interface between the semiconductor laser chip 302 and the carrier mounting 304 can result from the conversion of relatively weak, short range bonding interaction based on electrostatic forces, van der Waals forces, or the like into a more durable, stronger bonding interaction based on diffusion interactions of the metal atoms in the first and second bond preparation layers 306, 308.

Figure 6:
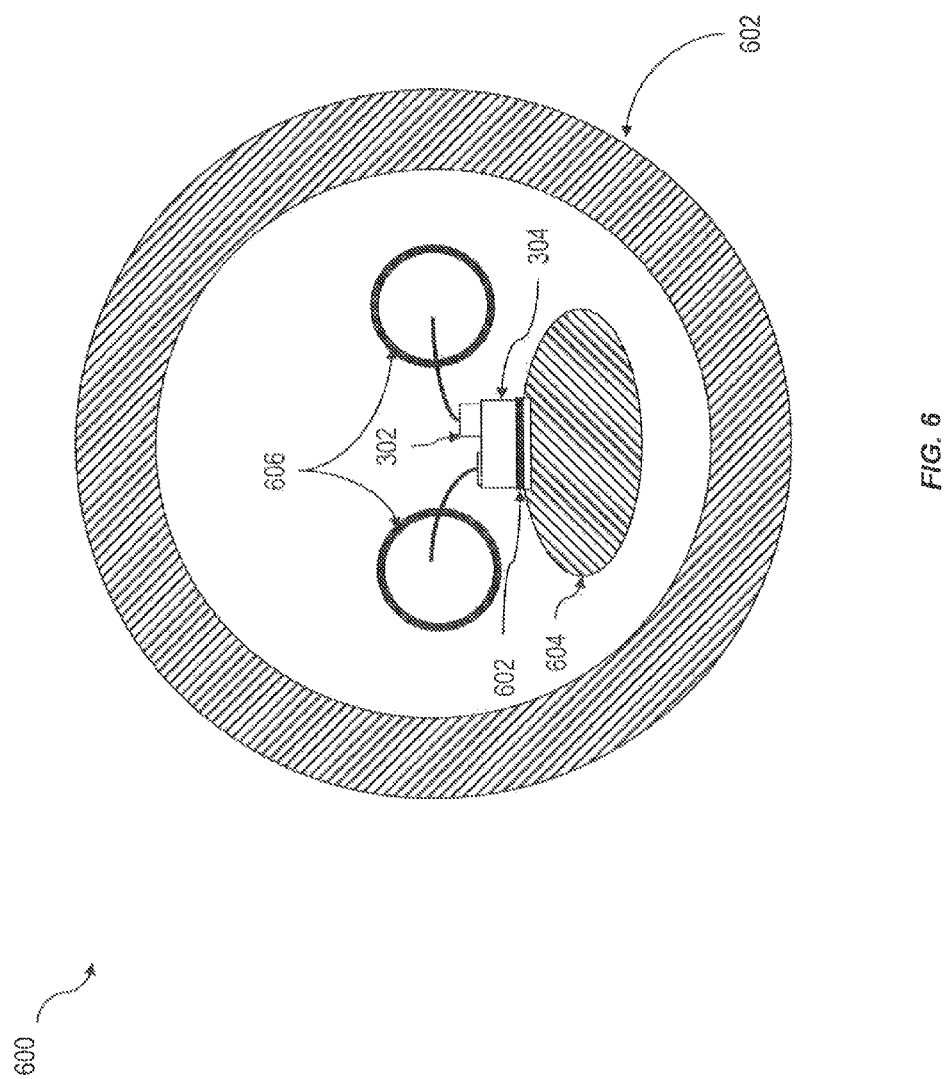
FIG. 6 is a diagram showing an end elevation view of a conventional TO-can mount such as are typically used for mounting semiconductor laser chips

FIG. 6 shows an end elevation view of a conventional transistor outline can (TO-can) mount 600 such as is typically used in mounting of semiconductor laser chips for use in telecommunications applications. TO-cans are widely used electronics and optics packaging platforms used for mechanically mounting, electrically connecting, and heat sinking semiconductor chips such as lasers and transistors and are available in a variety of different sizes and configurations. An outer body 602 encloses a post or heat sink member 604 which can be made of metal, such as for example a copper tungsten sintered metal, copper-diamond sintered metal, or iron-nickel alloys including Kovar, alloy 42, and alloy 52. Two insulated electrical pass-throughs 606 can be included to provide electrical contacts for connection to the p- and n-junctions on a semiconductor laser chip 302. The semiconductor laser chip 302 can be mounted to a carrier sub-mount, which can in some examples be formed of silicon. As noted above, the semiconductor laser chip 302 can be joined to the carrier mount 304 (also referred to as a carrier mounting) at first and second contact surfaces, one or more of which can include a bond preparation layer (not shown in FIG. 6 due to scale constraints) including a metal. The carrier mount 304 optionally be soldered to the post or heat sink member 604 by a solder layer 610.

According to one or more implementations of the current subject matter, mono-component layers (or surfaces) of a material dissimilar from the bond preparation layers 306, 308 can be included n either or both of the first contact surface 310 and the second contact surface 312. The material dissimilar from materials in either or both of the bond preparation layers 306, 308 can include but is not limited to gold, platinum, titanium, copper, silver, nickel. Indium tin lead (InSnPb) can serve similarly as a bond facilitation layer, enabling lower temperature joining of the first and second contact surfaces 310, 312. In joining metal components, this is commonly referred to as liquidus or liquid diffusion bonding since it apparently creates a very thin liquid interface layer between certain dissimilar metals, which are brought in physical contact under elevated temperature. The temperature necessary to cause this effect to occur is typically significantly lower than the melting temperatures of any of the components of the bonding layer taken individually. Once the initial joining has taken place, thermal separation can typically require quite high temperatures, approaching or reaching the component melting temperatures. In one example, contact between a silver surface and a gold surface can result in a hermetic joint at a temperature of approximately 150° C. to approximately 400° C., which is significantly lower than the separate melting temperatures of silver (950° C.) and gold (1064° C.). In another example, copper oxide can serve as a bonding promotion layer, which can reduce a joining temperature between two metal surfaces significantly below the metal melting points.

Thus, in some implementations, one or more bonding facilitating mono-component material layers or thin sheets (e.g. preforms) can be inserted at the interface between the first contact surface 310 and/or second contact surface 312 prior to the persistent bonding process. The one or more bond-facilitating mono-component material layers or thin sheets can be dissimilar from other barrier and/or metallization layers on the first contact surface 310 and/or second contact surface 312. One example of a method for applying bond-facilitating mono-component material layers or thin sheets can include depositing a thin layer of a metal differing from those metals present in the bond preparation layer on top of the barrier and/or metallization layers on the first contact surface 310 and/or second contact surface 312. Such a thin layer can be evaporated or otherwise deposited onto one or both of the first contact surface 310 and the second contact surface 312 shortly before the heat assisted joining process takes place, in order to prevent or minimize oxidation. Alternatively, a thin sheet of a metal dissimilar from the bond preparation layer can be placed between the semiconductor laser chip 302 and the mounting device 304. The bonding process can then proceed as discussed above. Material used in the bonding facilitation layer can include, but is not limited to silver (Ag), silicon (Si), germanium (Ge), copper (Cu), copper oxide (CuO), tin (Sn), lead (Pb), antimony (Sb), bismuth (Bi), indium (In) and the like.

The process that forms the bonding can be a diffusion bonding process, a rapid thermal annealing (RTA) process, a bonding facilitation process, or the like. A RTA process can include applying a very high temperature very quickly. Such a process can be used when a sintering process temperature exceeds semiconductor crystal limits and to shorten the process time. In another implementation a van der Waals force contact may be used without further heating to form the long term mechanical bond. In such an implementation, the semiconductor laser chip 302 can be secured to the carrier mounting 304 with epoxy or some other adhesive applied around the edges of the laser chip to protect the chip assembly from shear forces.

Inter-diffusion rates between first and second bond preparation layer 306, 308, for example using gold as the first and the second metal, can be accelerated and temperatures lowered by using at least one thermally evaporated gold layer which has grain boundaries accessible along which gold from the other joining surface can migrate to form a bond. In one example, a layer of thermally evaporated gold can be deposited over one or more layers of gold added to either or both of the first contact surfaces 310, 312 through sputtering. The one or more sputtered layer can provide a provide tough, dense film and can serve as a diffusion barrier while the thermally evaporated layer can have the necessary "softness" to allow rearrangement of the deposited atoms and thereby to facilitate diffusion bonding at relatively low temperatures.

Implementations of the current subject matter can provide one or more advantages, including but not limited to maintaining a contiguous diffusion barrier layer between a laser crystal or other semiconductor laser chip 302 and its physical mounting or support apparatus (e.g. a carrier mount or other mounting device 304), preventing inter-diffusion of contaminant compounds into the laser crystal and vice versa. By elimination of a soldering step and a solder layer disposed between the joined semiconductor laser chip 302 and carrier mount or other mounting device 304, potential difficulties associated with conventional approaches to joining these components of an optical system can be avoided or at least significantly reduced. For example, because soldering of a semiconductor laser chip to a carrier mount or other substrate is not necessary according to implementations of the current subject matter, elevated temperatures typical of soldering operations can be avoided. Damage to one or more diffusion barrier layers on either or both of the laser chip and the carrier mount or other substrate can be reduced or even eliminated due to the avoidance of elevated temperatures. Avoidance of the use of solders featuring lead can enhance or otherwise assist in compliance with the Restriction of Hazardous Substances Directive (promulgated in the European Union) and other similar regulations, advisories, or the like regarding minimization of the use of lead. Elimination of solder as part of the interface between a semiconductor laser chip and the carrier mounting or other substrate can also enhance the joint contiguity between the two joined surfaces.

In still other implementations of the current subject matter, diffusion barriers can optionally be avoided entirely by the use of a gold or other single metal bonding layer on the contact surfaces of each of the carrier mount mounting device or surface and the semiconductor laser chip. The gold or other single metal can serve as a barrier to diffusion of atoms or molecules between the carrier mount and the semiconductor laser chip and can also participate in diffusion bonding to adhere the semiconductor laser chip to the carrier mount or other mounting device or surface.

As noted above, in some observed examples using conventional semiconductor laser chip mounting approaches, induced shifts in the laser output can be greater than approximately a picometer per day. Implementations of the current subject matter can therefore include one or more techniques for improving barrier layers at one or more of the first contact surface 310 of the semiconductor laser chip 302 and the second contact surface 312 of the carrier mount or other mounting device 304. In one example implementation, an improved barrier layer at the second contact surface 312 can include an electroless plated nickel underlayer, for example to preserve edge definition of a copper tungsten submount or the like, covered by a minimum thickness of an electrolytic nickel layer as the final layer before deposition first or second bond preparation layer 306, 308, for example of gold or other metal.

In another example, a single layer of an evaporated or alternatively sputtered barrier material, including but not limited to at least one of nickel, platinum, palladium, and electrically conducting non-metallic barrier layers, can be used as a single barrier layer at the first contact surface 310 and/or the second contact surface 312. The bonding process to join the first contact surface 310 and the second contact surface 312 as discussed herein can optionally be performed under a non-oxidizing atmosphere or under a reducing atmosphere including but not limited to vacuum, pure nitrogen pure hydrogen gas ($H_2$), forming gas (approximately 5% hydrogen in 95% nitrogen), and formic acid in nitrogen carrier gas, releasing atomic hydrogen at temperatures above approximately 150° C., to remove or at least reduce the presence of oxidized compounds in the solder composition on the metalized semiconductor contact surface and the carrier mounting surface.

Suitable barrier layers to be deposited on the first contact surface 310 and/or the second contact surface 312 can include, but are not limited to, platinum (Pt), palladium (Pd), nickel (Ni), titanium nitride ($TiN_x$), titanium oxy-nitride ($TiN_xO_y$), tungsten nitride ($WN_x$), cerium oxide ($CeO_2$), and cerium gadolinium oxy-nitride ($CeGdO_yN_x$). These compounds, as well as other comparable compounds that can be deposited by sputtering or vapor deposition onto the first and/or second contact surfaces, can provide a barrier layer that has a sufficiently high temperature resistance during the diffusion bonding or other joining process as to not dissolve or otherwise degrade sufficiently to cause breakdown of the barrier qualities necessary to prevent cross-barrier diffusion of semiconductor laser materials into the bonding layer formed by joining of the bond preparation layers 306, 308 or into the crystal structure of the semiconductor laser chip 302. The second barrier layer applied to the second contact surface 312 can in some implementations include a sintered diamond-copper layer. A process for creation of a non-metallic, electrically-conducting barrier layer can include first depositing titanium via a thin film deposition process, including but not limited to sputtering, electron beam evaporation, chemical vapor deposition, atomic layer deposition, and the like, and then adding nitrogen to react with the deposited titanium. In another implementation, a first metallization layer can be deposited by a thin film deposition process, and nitrogen ions can be used for sputtering titanium, for example in a nitrogen gas background, to create the non-metallic barrier layer. Chemical vapor deposition can also or alternatively be used to create non-metallic barrier layers. In another implementation, gas phase reactions of the components elements or compounds forming the non-metallic electrically conductive compound can be used to create multi-component non-metallic barrier layers.

In some implementations, the heat conductivity of a carrier mounting 304 can advantageously exceed 1 Watt per meter-Kelvin or, optionally 10 Watts per meter-Kelvin or, optionally 25 Watts per meter-Kelvin or, optionally 50 Watts per meter-Kelvin or, optionally 100 Watts per meter-Kelvin or, optionally 150 Watts per meter-Kelvin. Suitable materials from which a carrier mounting can be constructed can include, but are not limited to, copper, copper tungsten, tungsten, aluminum, copper-diamond, aluminum nitride, germanium, silicon, silicon nitride, silicon carbide, gallium arsenide, gallium nitride, gallium antimonide, indium phosphide, beryllium oxide, boron nitride, alumina ($Al_2O_3$), sapphire, diamond, steel, Kovar, Alloy 42, Alloy 52, and the like. A carrier mounting 304 that is thermally expansion matched to the materials of the semiconductor laser chip 302 can be used in some implementations. In one example consistent with an implementation of the current subject matter, a carrier mounting 304 chosen from a sintered metal heat spreader including approximately 15% copper and approximately 85% tungsten, a beryllium oxide heat spreader, an alumina heat spreader, a sapphire heat spreader, a diamond heat spreader, a copper-diamond heat spreader, an aluminum-nitride heat spreader, a silicon carbide heat spreader, a silicon heat spreader, a silicon nitride heat spreader, a germanium (Ge) heat spreader, a gallium arsenide (GaAs) heat spreader, a gallium-antimonide (GaSb) heat spreader, a gallium nitride (GaN) heat spreader, an indium phosphide (InP) heat spreader, or the like can provide a good thermal expansion match to a gallium antimonide (GaSb) semiconductor laser chip 302 having a thermal expansion coefficient of approximately 7 ppm $°C.^{-1}$. In another example consistent with an implementation of the current subject matter, a carrier mounting 304 can be chosen from a pure tungsten heat spreader, a sintered copper tungsten metal heat spreader, a germanium (Ge) heat spreader, a silicon heat spreader, a silicon nitride heat spreader, a silicon carbide heat spreader, an alumina heat spreader, a beryllium oxide (BeO) heat spreader, a sapphire heat spreader, a diamond heat spreader, a copper diamond heat spreader, an indium phosphide (InP) heat spreader, a gallium arsenide (GaAs) heat spreader, a gallium antimonide (GaSb) heat spreader or an aluminum nitride (AlN) heat spreader can provide a good thermal expansion match to an indium phosphide (InP) semiconductor laser chip 302 having a thermal expansion coefficient of approximately 4.5 ppm $°C.^{-1}$. One or more non-metallic materials, such as for example silicon, silicon carbide, silicon nitride, indium phosphide (InP), gallium arsenide (GaAs), gallium nitride (GaN), gallium antimonide (GaSb), aluminum nitride, diamond, sapphire or the like can also be used as the carrier mounting 304, for example for an indium phosphide (InP) semiconductor laser chip 304 or alternately for a gallium antimonide (GaSb) semiconductor laser chip 302, a gallium arsenide (GaAs) semiconductor laser chip 302, a gallium nitride (GaN) semiconductor laser chip 302, or the like.

Other options for a suitable carrier mounting 304 consistent with implementations of the current subject matter can include, but are not limited to, shaped copper tungsten heat spreaders, including but not limited to semiconductor laser industry standard c-mounts and CT-mounts, TO-cans, pattern metalized ceramics, pattern metalized germanium, pattern metalized silicon, pattern metalized silicon carbide, pattern metalized silicon nitride, pattern metalized indium phosphide, pattern metalized gallium arsenide, pattern metalized gallium antimonide, pattern metalized beryllium oxide, pattern metalized alumina, pattern metalized aluminum nitride, pattern metalized diamond, pattern metalized sapphire, copper-diamond, pure copper, pure copper with one or more sections of expansion-matched submounts to match to one or more semiconductor laser chip compositions, tungsten submounts brazed into a copper or copper tungsten c-mount, or the like. A semiconductor laser chip 302 can optionally be formed of indium phosphide crystals, gallium arsenide crystals, gallium antimonide crystals, gallium nitride crystals, and the like.

In some implementations of the current subject matter, a carrier mounting 304 formed of germanium, silicon, silicon carbide, alumina, sapphire, diamond, gallium arsenide, gallium antimonide, gallium nitride, indium phosphide, aluminum nitride, alumina, beryllium oxide, or silicon nitride, silica, or a similar non-metallic material can be metalized, for example with a metal film including a metal for use in a second bond preparation layer 308. In some examples, the metal can be gold. A first bond preparation layer 306 can be formed on a smoother formed first contact surface on a semiconductor laser chip 302. The first bond preparation layer 306 can include the same metal (e.g. gold) used in the second bond preparation layer 308. In this example, the first contact surface 310 of the semiconductor laser chip 302 can be formed to a significantly low surface roughness (for example similar to one of the surface roughness values or ranges discussed above). The second contact surface 312 of the carrier mount or other mounting device 304 can in some implementations of the current subject matter not require surface treatment to reduce the surface roughness due to addition of a sufficiently thick metallization layer of the metal forming the second bond preparation layer 308. Referring to the system 300 shown in FIG. 3, one of the electrical connections 314 can be made directly to the second bond preparation layer 308 on the second contact surface. Another electrical connection 314 can be made to the semiconductor laser chip 302 as shown in FIG. 3.

Figure 7:
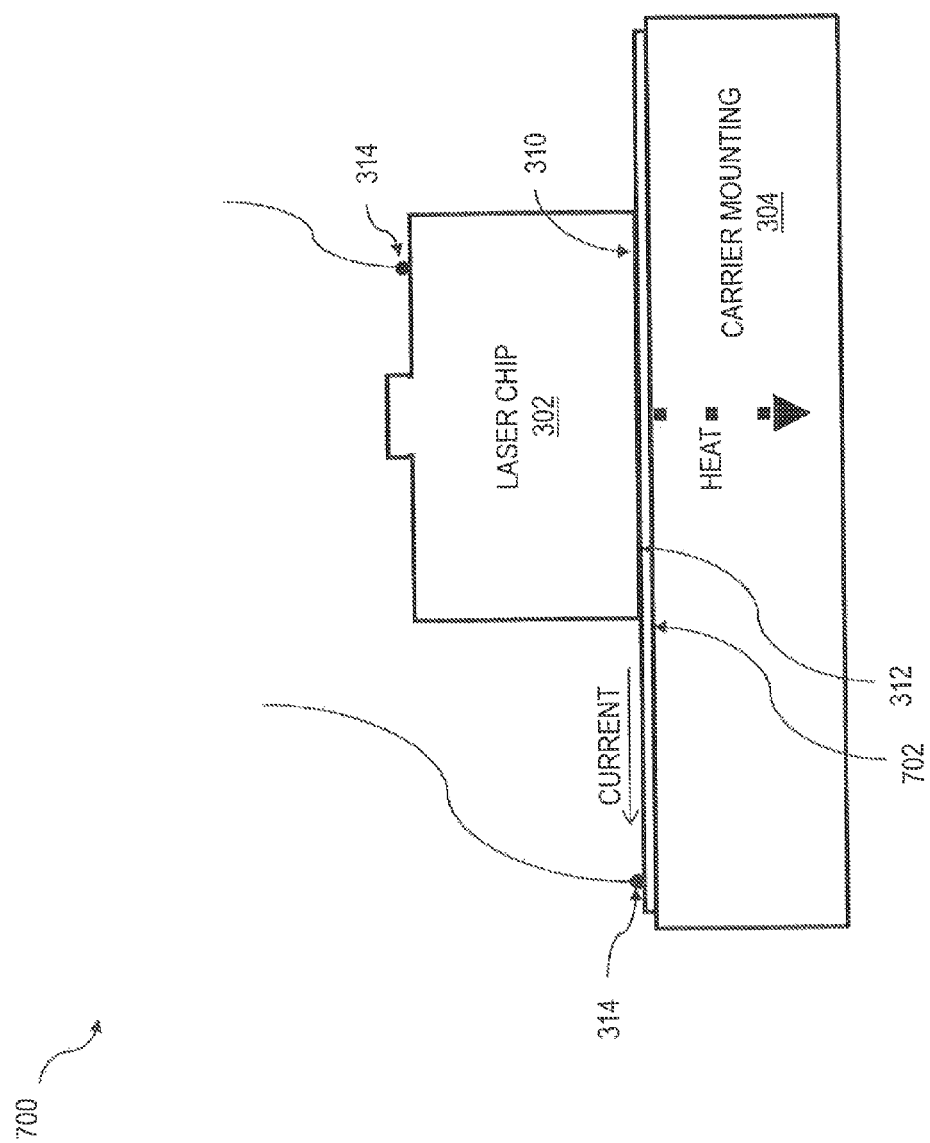
FIG. 7 is a diagram illustrating a semiconductor laser chip secured to a carrier mounting consistent with one or more implementations of the current subject matter.

For example, FIG. 7 illustrates an example of a mounted semiconductor laser apparatus 700 consistent with implementations of the current subject matter. As shown in FIG.

7, a semiconductor laser chip 302 is affixed to a carrier mounting 304, which in this example can also act as a heat sink and can include one or more electrically insulating but thermally conducting materials such as for example aluminum nitride (AlN), aluminum oxide ($Al_2O_3$), beryllium oxide (BeO), silicon (Si), germanium (Ge), sapphire, diamond, gallium arsenide (GaAs), gallium antimonide (GaSb), gallium nitride (GaN), indium phosphide (InP), silicon nitride (SiN), silicon carbide (SiC), and the like. The carrier mounting 304 can advantageously be prepared or otherwise formed to have a second contact surface 312 having a surface roughness of less than approximately 500 Å, less than approximately 250 Å, less than approximately 100 Å, less than approximately 50 Å, or the like. A metallization layer 702 can be applied to form the second contact surface 312 on the carrier mounting 304. The metallization layer 702 can optionally include one or more metals selected from gold, copper, platinum, or other metals discussed elsewhere in this disclosure as suitable for use in a bonding preparation layer. The semiconductor laser chip 302 can be affixed to the carrier mounting 304 by a diffusion bonding approach as discussed above. Alternatively or in addition, one or more other approaches, such as for example mechanical attachment, adhesive, or the like, can serve to secure or assist in securing the semiconductor laser chip 302 to the carrier mounting 304 such that the first contact surface 310 and second contact surface 312 are held in consistent and durable contact. Because the bulk material of the carrier mounting 304 in FIG. 7 can be electrically insulating, at least one of the electrical connections 314 can be attached to the metallization layer 702. One or more other electrical connections 314 can be made to the semiconductor laser chip 302 such that current can flow between the electrical connections 314 in a path including at least part of the metallization layer 702 and at least part of the semiconductor laser chip 302.

Figure 8:
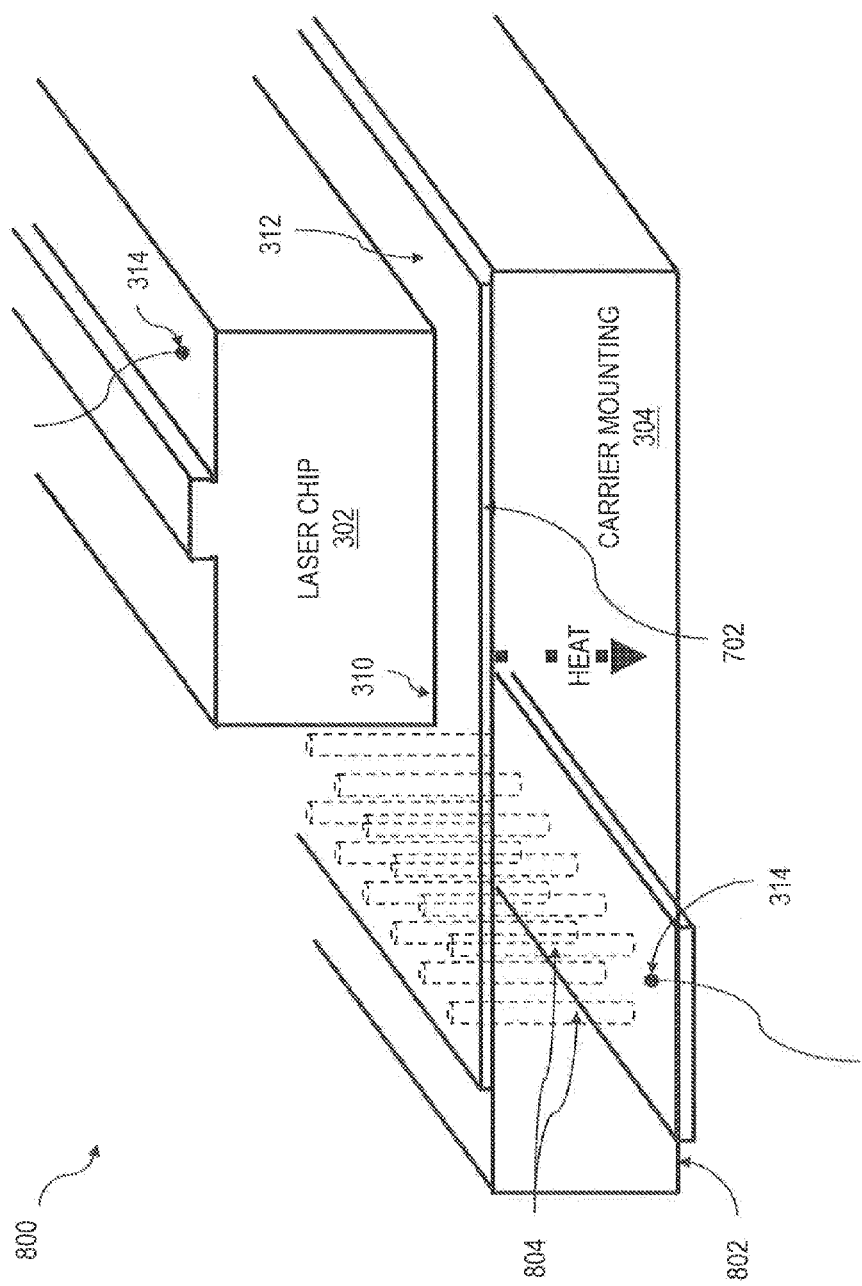
FIG. 8 is a diagram illustrating a semiconductor laser chip secured to a carrier mounting consistent with one or more implementations of the current subject matter.

Other approaches to attaching the one or more electrical connections 314 are also within the scope of the current subject matter. For example, FIG. 8 illustrates an example of a mounted semiconductor laser apparatus 800 consistent with implementations of the current subject matter. As in FIG. 7, in FIG. 8 a semiconductor laser chip 302 is affixed to a carrier mounting 304, which can also act as a heat sink and can include one or more electrically insulating but thermally conducting materials such as for example those discussed above. Also as in FIG. 7, the semiconductor laser chip 302 can be bonded or otherwise affixed to the carrier mounting 304 at a second contact surface 312 on the carrier mounting 304, and the second contact surface 312 can include metallization layer 702. At least one electrical connection 314 can be attached to the semiconductor laser chip 302 itself. One or more other electrical connections 314 can be made to the metallization layer 702. However, unlike in the apparatus of FIG. 7 in which the one or more other electrical connections 314 are made on a same face of the carrier mounting as the second contact surface 312, as shown in FIG. 8, the one or more other electrical connections 314 can be made on another surface or face 802 of the carrier mounting 304. One or more electrically conductive (e.g. metal) vias or other connecting features 804 can be formed through the body of the carrier mounting such that an electrical current path is formed between a metallization layer 702 (which includes the second contact surface 312) and an attachment position 804 on another surface or face of the other surface or face 802 of the carrier mounting 304. In this example, the one or more other electrical connections 314 can optionally be formed using solder, a mechanical connection, or the like. Removal of the attachment position 804 for the one or more other electrical connections 314 to the other surface or face 802 of the of the carrier mounting 304 can allow the use of other attachment approaches by mitigating concerns about potential effects on laser temperature and frequency response due to contamination, damage, changes in resistivity, or the like of the interface between the semiconductor laser chip 302 and the carrier mounting 302.

Figure 9:
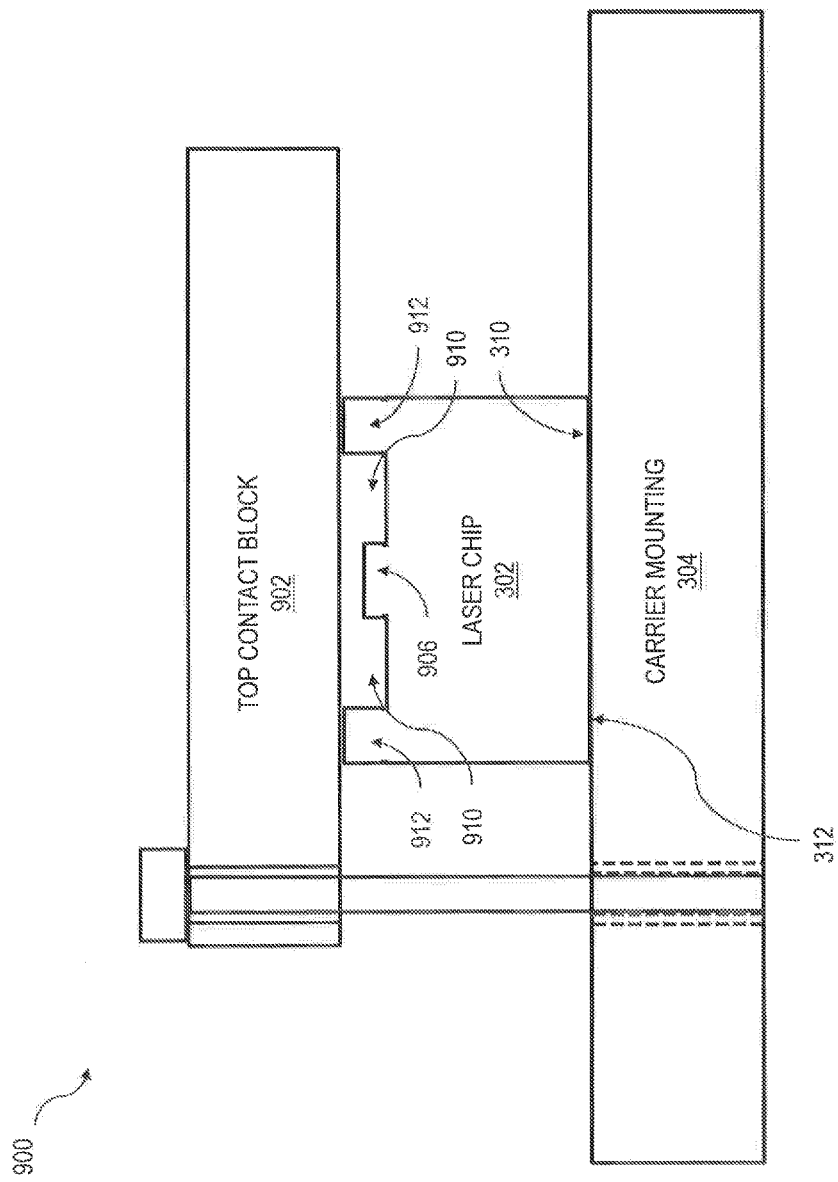
FIG. 9 is a diagram illustrating a semiconductor laser chip secured to a carrier mounting consistent with one or more implementations of the current subject matter.

FIG. 9 illustrates an example of a mounted semiconductor laser apparatus 900 consistent with implementations of the current subject matter in which a semiconductor laser chip 302 is held in contact with a carrier mounting 304 via a clamping apparatus or other mechanical device. In this example, a top contact block 902 or other clamping feature can be used to hold the semiconductor laser chip 302, for example a first contact surface 310 of the semiconductor laser chip 302, in contact with the carrier mounting 304, and advantageously with an electrically second contact surface 312 on the carrier mounting 304. A top surface of a typically semiconductor laser chip 302 (e.g. a surface opposite from the first contact surface 310) can in many cases include a lasing portion 906 of the semiconductor laser chip 302. A lasing portion 906 as used herein can refer to one or more of a diffraction grating, an active ridge, or other functionally or structurally similar features that are operable to determine, control, etc. the wavelength of laser radiation emitted by the semiconductor laser chip 302. To enable a mechanical contact to be made, for example with a top contact block 902 such as is shown in FIG. 9, with the surface of the semiconductor laser chip that includes a lasing portion 906, care is advantageously taken to avoid causing damage to the lasing portion 906 or otherwise affecting its physical and electrical structure. Accordingly, consistent with one or more implementations of the current subject matter, the lasing portion 906 can be formed in a well or other depression (hereinafter referred to as a "well 910") on a surface of the semiconductor laser chip 302. Such a well 910 can in some examples be formed by etching one or more trenches into the semiconductor laser chip 302 to separate the lasing portion 906 both physically and electrically, from upper surfaces of one or more structural ridges 912 whose elevation above the one or more trenches is greater than an elevation of the lasing portion 906. In some examples, the one or more structural ridges 912 can be formed of a material such as silicon nitride, silicon carbide, or the like, which can be electrically isolated and metallized on a contact surface that is contacted by the top contact block 902. A configuration as illustrated in FIG. 9 can also optionally include one or more metal vias or other conductive pass-throughs (e.g. similar to those illustrated in FIG. 8) to allow at least one electrical connection 314 to be made on an opposite side of the carrier mounting 304 than where the carrier mounting 304 contacts the semiconductor laser chip 302.

The force holding a semiconductor laser chip 302 in contact with a carrier mounting 304 and ensuring a stable electrical contact can be applied in a variety of ways, including but not limited to screws (e.g. as shown in FIG. 9), high temperature compression fitting using materials with a lower thermal expansion coefficient than the semiconductor laser chip 302 and assembling the apparatus at a higher temperature than the typical laser operating temperature, an epoxy or ceramic adhesive applied to one or more edges of the semiconductor laser chip 302

Figure 10:
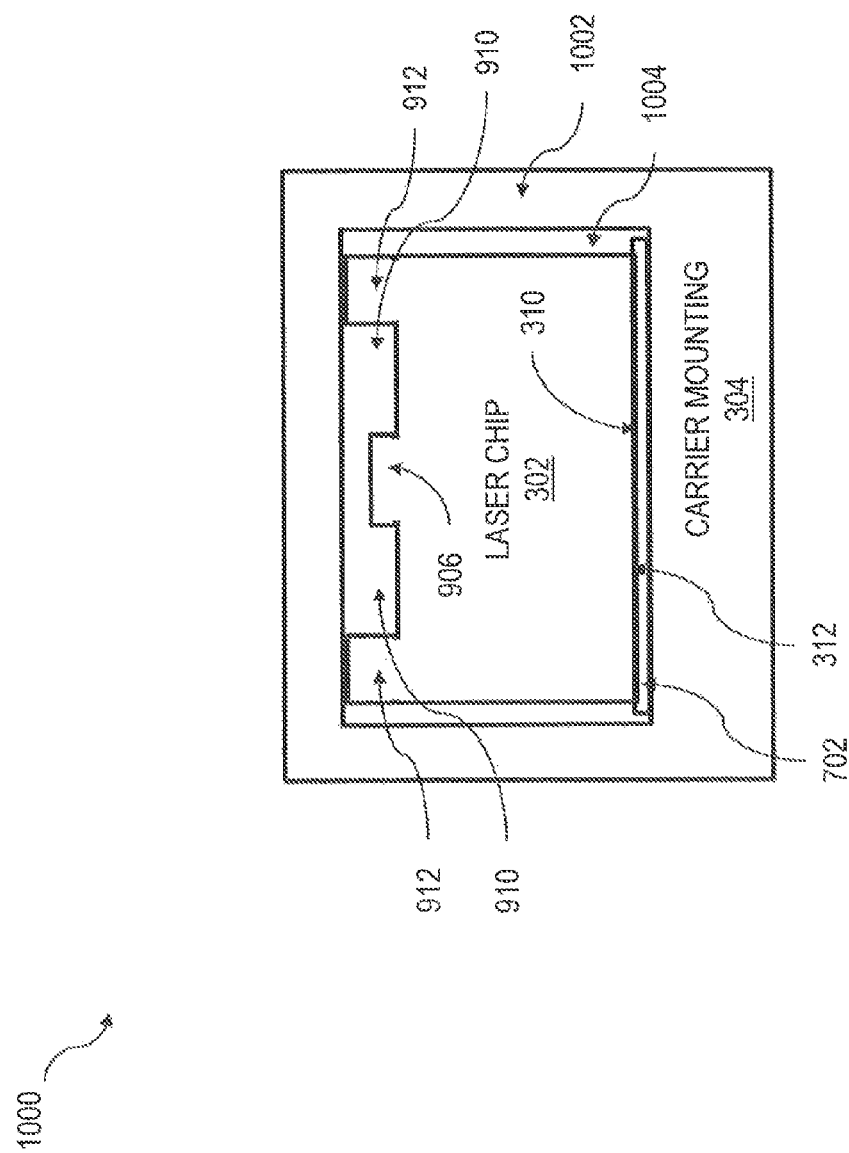
FIG. 10 is a diagram illustrating a semiconductor laser chip secured to a carrier mounting consistent with one or more implementations of the current subject matter.

In another example shown in FIG. 10, a mounted semiconductor laser apparatus 1000 consistent with implementations of the current subject matter can include a semiconductor laser chip 302 held in contact with a carrier mounting 304 via a clamping apparatus or other mechanical device 1002. In the example of FIG. 10, the carrier mounting 304 can be an integral part of the clamping apparatus or other mechanical device 1002, which can optionally be formed of at least one piece of a ceramic, or of at least one piece of semiconductor material, or other comparable material having an orifice 1004 sized approximately equivalently to a cross sectional dimension of the semiconductor laser chip 302. Alternatively, the clamping apparatus or other mechanical device 1002 can be a second piece that is mechanically secured to a carrier mounting 304 by one or more mechanical, adhesive, etc. approaches. A metallization layer 702 can be added to a second contact surface 312 on the carrier mounting 304 as discussed above to provide electrical conductivity for current flow via the interface between it and the first contact surface 302 on the semiconductor laser chip 302. As discussed above in reference to other figures, one or more electrical connections (not shown in FIG. 10) can be made to the metallization layer 702 as well as to the semiconductor laser chip 302 to provide a current loop. If the material of the clamping apparatus or other mechanical device 1002 has a lower thermal expansion coefficient than the semiconductor laser chip 302, the semiconductor laser chip 302 can be placed into the orifice 1004 when the apparatus is at a first temperature. At a higher second temperature, the semiconductor laser chip 302 will expand more than the clamping apparatus or other mechanical device 1002 (and therefore the orifice 1004) thereby causing a compressive force urging the first and second contact surfaces 310, 312 into compressive contact at the higher second temperature.

Figure 11:
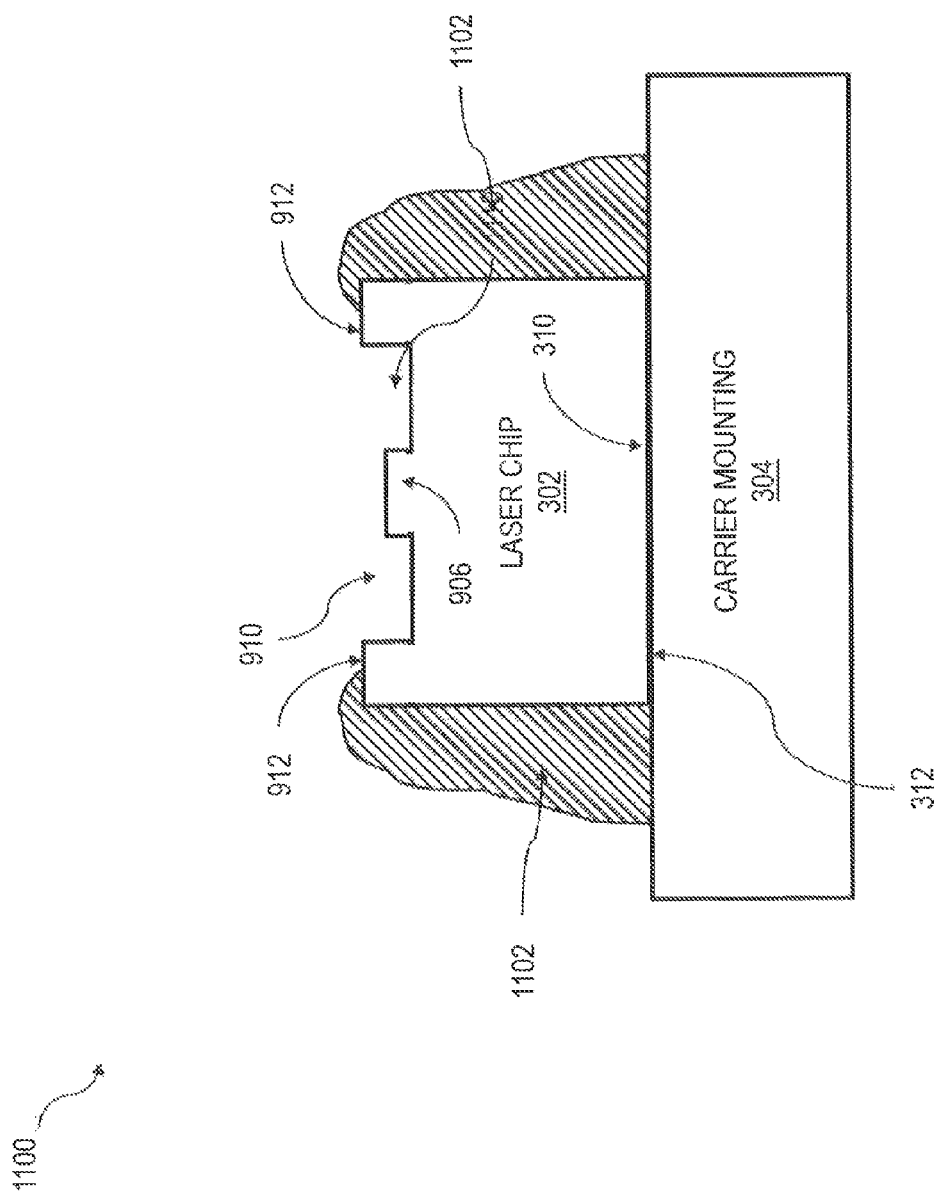
FIG. 11 is a diagram illustrating a semiconductor laser chip secured to a carrier mounting consistent with one or more implementations of the current subject matter.

FIG. 11 shows another example of a mounted semiconductor laser apparatus 1100 consistent with implementations of the current subject matter. A ceramic adhesive 1102 can be applied around at least part of a perimeter of the semiconductor laser chip 302. The ceramic adhesive 1102 can contact and adhere to a surface of the carrier mounting, which can optionally be electrically conductive or an electrical insulator with a metallized second contact surface 312. The ceramic adhesive 1102 can also overlap onto a top surface of the semiconductor laser chip 302, for example onto upper surfaces of one or more structural ridges 912 whose elevation above one or more trenches 910 formed around and a lasing portion 906. If the ceramic adhesive has a lower coefficient of thermal expansion than the semiconductor laser chip 302 and is applied at a temperature lower than an operating temperature of the semiconductor laser chip 302, the greater expansion of the semiconductor laser chip 302 will cause a force to be exerted by the overlap of the ceramic adhesive 1102 onto the upper surfaces of one or more structural ridges 912, thereby causing a compressive force urging the first and second contact surfaces 310, 312 into compressive contact. In an alternative implementation of the current subject matter, the ceramic adhesive can be substituted with a non electrically conductive adhesive.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. For example, other techniques and features can be used in the alternative or in addition to those discussed above for joining a semiconductor laser chip 302 and a carrier mounting 304 without the use of soldering. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed:

1. A method comprising:

forming a first contact surface of a semiconductor laser chip to a first target surface roughness and a second contact surface of a carrier mounting to a second target surface roughness;

contacting the first contact surface with the second contact surface; and performing a solderless securing process to further secure the semiconductor laser chip to the carrier mounting, the solderless securing process comprising at least one of:

applying a first adhesive composition around at least part of a perimeter of an interface between the first contact surface and the second contact surface, the first adhesive composition comprising an electrically non-conducting adhesive having a first thermal expansion coefficient that is less than a second thermal expansion coefficient of the semiconductor laser chip, and a continuous portion of the adhesive composition bonds to the carrier mounting and also overlaps onto a top surface of the semiconductor laser chip;

applying a second adhesive composition around at least part of the perimeter of the interface between the first contact surface and the second contact surface, the second adhesive composition comprising a ceramic adhesive having the first thermal expansion coefficient that is less than the second thermal expansion coefficient of the semiconductor laser chip, and the continuous portion of the adhesive composition bonds to the carrier mounting and also overlaps onto the top surface of the semiconductor laser chip;

applying a first mechanical force normal to the second contact surface, the first mechanical force being applied to the top surface of the semiconductor laser chip and urging the first contact surface into contact with the second contact surface, the top surface of the semiconductor laser chip being at least approximately opposite to the first contact surface, the top surface comprising one or more structural ridges whose elevation above at least one trench etched into the top surface is greater than a second elevation of a lasing portion of the semiconductor laser chip above the at least one trench, and the mechanical force is applied to the one or more structural ridges; and applying a second mechanical force normal to the second contact surface, the second mechanical force being applied to the top surface of the semiconductor laser chip and urging the first contact surface into contact with the second contact surface, the top surface of the semiconductor laser chip being at least approximately opposite to the first contact surface, the second mechanical force applied by a clamping apparatus or other mechanical device having the first thermal expansion coefficient that is less than the second thermal expansion coefficient of the semiconductor laser chip such that thermal expansion of the semiconductor laser chip at a laser operating temperature acts against the clamping apparatus or other mechanical device to cause a compressive force urging the first contact surface into contact with the second contact surface.

2. A method as in claim 1, wherein the solderless securing process comprises applying the first mechanical force normal to the second contact surface, the first mechanical force being applied to the top surface of the semiconductor laser chip and urging the first contact surface into contact with the second contact surface, the top surface of the semiconductor laser chip being at least approximately opposite to the first contact surface, the top surface comprising one or more structural ridges whose elevation above the at least one trench etched into the top surface is greater than the second elevation of the lasing portion of the semiconductor laser chip above the at least one trench, and the mechanical force is applied to the one or more structural ridges.

3. A method as in claim 1, wherein the solderless securing process comprises applying the second mechanical force normal to the second contact surface, the second mechanical force being applied to the top surface of the semiconductor laser chip and urging the first contact surface into contact with the second contact surface, the top surface of the semiconductor laser chip being at least approximately opposite to the first contact surface, the second mechanical force applied by the clamping apparatus or other mechanical device having the first thermal expansion coefficient that is less than the second thermal expansion coefficient of the semiconductor laser chip such that thermal expansion of the semiconductor laser chip at the laser operating temperature acts against the clamping apparatus or other mechanical device to cause the compressive force urging the first contact surface into contact with the second contact surface.

4. A method as in claim 1, wherein the solderless securing process comprises applying the first adhesive composition around at least part of the perimeter of the interface between the first contact surface and the second contact surface, the first adhesive composition comprising the electrically non-conducting adhesive having the first thermal expansion coefficient that is less than the second thermal expansion coefficient of the semiconductor laser chip, and the continuous portion of the adhesive composition bonds to the carrier mounting and also overlaps onto the top surface of the semiconductor laser chip.

5. A method as in claim 1, wherein the solderless securing process comprises applying the second adhesive composition around at least part of the perimeter of the interface between the first contact surface and the second contact surface, the second adhesive composition comprising the ceramic adhesive having the first thermal expansion coefficient that is less than the second thermal expansion coefficient of the semiconductor laser chip, and the continuous portion of the adhesive composition bonds to the carrier mounting and also overlaps onto the top surface of the semiconductor laser chip.

6. An article of manufacture comprising:
a first contact surface of a semiconductor laser chip formed to a first target surface roughness;
a second contact surface of a carrier mounting formed to a second target surface roughness;
an interface at which the first contact surface contacts the second contact surface, wherein the semiconductor laser chip is secured to the carrier mounting by a solderless attachment, the solderless attachment comprising at least one of:
a first adhesive composition applied around at least part of a perimeter of an interface between the first contact surface and the second contact surface, the adhesive composition comprising a ceramic adhesive having a first thermal expansion coefficient that is less than a second thermal expansion coefficient of the semiconductor laser chip, and a continuous portion of the adhesive composition bonds to the carrier mounting and also overlaps onto a top surface of the semiconductor laser chip;
a second adhesive composition applied around at least part of a perimeter of an interface between the first contact surface and the second contact surface, the adhesive composition comprising a ceramic adhesive having a first thermal expansion coefficient that is less than a second thermal expansion coefficient of the semiconductor laser chip, and a continuous portion of the adhesive composition bonds to the carrier mounting and also overlaps onto a top surface of the semiconductor laser chip;
a first device applying a first mechanical force normal to the second contact surface, the mechanical force being applied to a top surface of the semiconductor laser chip and urging the first contact surface into contact with the second contact surface, the top surface of the semiconductor laser chip being at least approximately opposite to the first contact surface, the top surface comprising one or more structural ridges whose elevation above at least one trench etched into the top surface is greater than a second elevation of a lasing portion of the semiconductor laser chip above the at least one trench, and the mechanical force is applied to the one or more structural ridges; and
a second device applying a second mechanical force normal to the second contact surface, the mechanical force being applied to a top surface of the semiconductor laser chip and urging the first contact surface into contact with the second contact surface, the top surface of the semiconductor laser chip being at least approximately opposite to the first contact surface, the second mechanical force applied by a clamping apparatus or other mechanical device having a first thermal expansion coefficient that is less than a second thermal expansion coefficient of the semiconductor laser chip such that thermal expansion of the semiconductor laser chip at a laser operating temperature acts against the clamping apparatus or other mechanical device to cause a compressive force urging the first contact surface into contact with the second contact surface.

7. An article of manufacture as in claim 6, comprising the second device applying the second mechanical force normal to the second contact surface, the mechanical force being applied to the top surface of the semiconductor laser chip and urging the first contact surface into contact with the second contact surface, the top surface of the semiconductor laser chip being at least approximately opposite to the first contact surface, the second mechanical force is applied by the clamping apparatus or other mechanical device having the first thermal expansion coefficient that is less than the second thermal expansion coefficient of the semiconductor laser chip such that thermal expansion of the semiconductor laser chip at the laser operating temperature acts against the clamping apparatus or other mechanical device to cause the compressive force urging the first contact surface into contact with the second contact surface.

8. An article of manufacture as in claim 6, comprising the first adhesive composition applied around at least part of the perimeter of the interface between the first contact surface and the second contact surface, the first adhesive composition comprising the ceramic adhesive having the first thermal expansion coefficient that is less than the second thermal expansion coefficient of the semiconductor laser chip, and the continuous portion of the adhesive composition bonds to the carrier mounting and also overlaps onto the top surface of the semiconductor laser chip.

9. An article of manufacture as in claim 6, comprising the second adhesive composition applied around at least part of the perimeter of the interface between the first contact surface and the second contact surface, the second adhesive composition comprising the ceramic adhesive having the first thermal expansion coefficient that is less than the second thermal expansion coefficient of the semiconductor laser chip, and the continuous portion of the adhesive composition bonds to the carrier mounting and also overlaps onto the top surface of the semiconductor laser chip.

10. An article of manufacture as in claim 6, comprising the first device applying the first mechanical force normal to the second contact surface, the first mechanical force being applied to the top surface of the semiconductor laser chip and urging the first contact surface into contact with the second contact surface, the top surface of the semiconductor laser chip being at least approximately opposite to the first contact surface, the top surface comprising one or more structural ridges whose elevation above the at least one trench etched into the top surface is greater than the second elevation of the lasing portion of the semiconductor laser chip above the at least one trench, and the mechanical force is applied to the one or more structural ridges.

* * * * *